(12) United States Patent
Ueta

(10) Patent No.: US 12,720,950 B2
(45) Date of Patent: Aug. 25, 2026

(54) LIGHT-EMITTING ELEMENT, DISPLAY DEVICE, AND METHOD OF MANUFACTURING LIGHT-EMITTING ELEMENT FOR RESTRAINING FORMATION OF CARRIER TRAPS

(71) Applicant: SHARP KABUSHIKI KAISHA, Sakai City (JP)

(72) Inventor: Yoshihiro Ueta, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 386 days.

(21) Appl. No.: 18/273,046

(22) PCT Filed: Jan. 22, 2021

(86) PCT No.: PCT/JP2021/002160

§ 371 (c)(1),
(2) Date: Jul. 19, 2023

(87) PCT Pub. No.: WO2022/157907

PCT Pub. Date: Jul. 28, 2022

(65) Prior Publication Data

US 2024/0114710 A1 Apr. 4, 2024

(51) Int. Cl.
*H10K 50/10* (2023.01)
*H10K 50/15* (2023.01)
*H10K 50/16* (2023.01)
*H10K 59/00* (2023.01)

(52) U.S. Cl.
CPC ............. *H10K 50/16* (2023.02); *H10K 50/10* (2023.02); *H10K 50/15* (2023.02); *H10K 59/00* (2023.02)

(58) Field of Classification Search
CPC ......... H10K 50/10; H10K 50/16; H10K 50/15
See application file for complete search history.

(56) References Cited

U.S. PATENT DOCUMENTS

2005/0224789 A1* 10/2005 Seo .................. H10K 59/80518 257/40
2007/0103068 A1 5/2007 Bawendi et al.
2012/0238047 A1 9/2012 Bawendi et al.
2012/0292595 A1 11/2012 Bawendi et al.
2017/0125635 A1 5/2017 Bawendi et al.

FOREIGN PATENT DOCUMENTS

JP 2000268971 A 9/2000
JP 2012-023388 A 2/2012

* cited by examiner

*Primary Examiner* — Suberr L Chi
(74) *Attorney, Agent, or Firm* — ScienBiziP, P.C.

(57) ABSTRACT

A light-emitting element includes: a first electrode; a first charge transport layer; a silicide layer containing silicide; a light-emitting layer; and a second electrode, all of which are provided in this order. The first charge transport layer and the light-emitting layer are adjacent to each other via the silicide layer.

20 Claims, 12 Drawing Sheets

START
FORM SUBSTRATE
S2
FORM ANODES
S4
FORM BANK
S6
FORM HOLE TRANSPORT LAYER
S8
STACK NANOPARTICLES TO FORM STACK BODY
S10
FORM SILICIDE LAYER BY THERMALLY PROCESSING STACK BODY OF NANOPARTICLES
S12
FORM LIGHT-EMITTING LAYER
S14
FORM ELECTRON TRANSPORT LAYER
S16
FORM CATHODES
S18
END

1A

12

10 e−

8

2A

6 h+

4

3

LIGHT-EMITTING ELEMENT, DISPLAY DEVICE, AND METHOD OF MANUFACTURING LIGHT-EMITTING ELEMENT FOR RESTRAINING FORMATION OF CARRIER TRAPS

TECHNICAL FIELD

The disclosure relates to a light-emitting element and a display device including the light-emitting element.

BACKGROUND ART

Patent Literature 1 discloses a light-emitting device including a light-emitting element containing semiconductor nanocrystals. The light-emitting element described in Patent Literature 1 includes a charge transport layer between a light-emitting layer and an electrode.

CITATION LIST

Patent Literature

Patent Literature 1: Japanese Unexamined Patent Application Publication, Tokukai, No. 2012-23388

SUMMARY

Technical Problem

According to Patent Literature 1, in a portion where the light-emitting layer is in contact with the charge transport layer, the interface portion between the light-emitting layer and the charge transport layer which are in contact with each other has an interfacial energy level. Therefore, carrier traps form at the interface portion between the light-emitting layer and the charge transport layer. As the carriers injected from the electrode are captured in these carrier traps, the efficiency of carrier injection to the light-emitting layer falls, which in turn causes decreases in the luminous efficiency of the entire light-emitting element.

Solution to Problem

To address these problems, the present disclosure is directed to a light-emitting element including: a first electrode; a first charge transport layer; a silicide layer containing silicide; a light-emitting layer; and a second electrode, all of which are provided in a stated order, wherein the first charge transport layer and the light-emitting layer are adjacent to each other via the silicide layer.

The present disclosure is directed also to a method of manufacturing a light-emitting element including: a first electrode; a first charge transport layer; a silicide layer containing silicide; a light-emitting layer; and a second electrode, all of which are provided in a stated order, wherein the first charge transport layer and the light-emitting layer are adjacent to each other via the silicide layer, the method including a silicide layer forming step of forming the silicide layer by thermally processing a stack of a layer of Si nanoparticles and a layer of metal nanoparticles.

The present disclosure is directed also to a method of manufacturing a light-emitting element including: a first electrode; a first charge transport layer; a silicide layer containing silicide; a light-emitting layer; and a second electrode, all of which are provided in a stated order, wherein the first charge transport layer and the light-emitting layer are adjacent to each other via the silicide layer, the method including a silicide layer forming step of forming the silicide layer by thermally processing a stack of a layer of $SiO_2$ nanoparticles and a layer of metal nanoparticles.

Advantageous Effects of Disclosure

The present disclosure, in an aspect thereof, can restrain the formation of carrier traps between the light-emitting layer and the charge transport layer and therefore restrain decreases in the luminous efficiency of the light-emitting element.

DESCRIPTION OF EMBODIMENTS

Embodiment 1

Overview of Display Device

Figure 2:
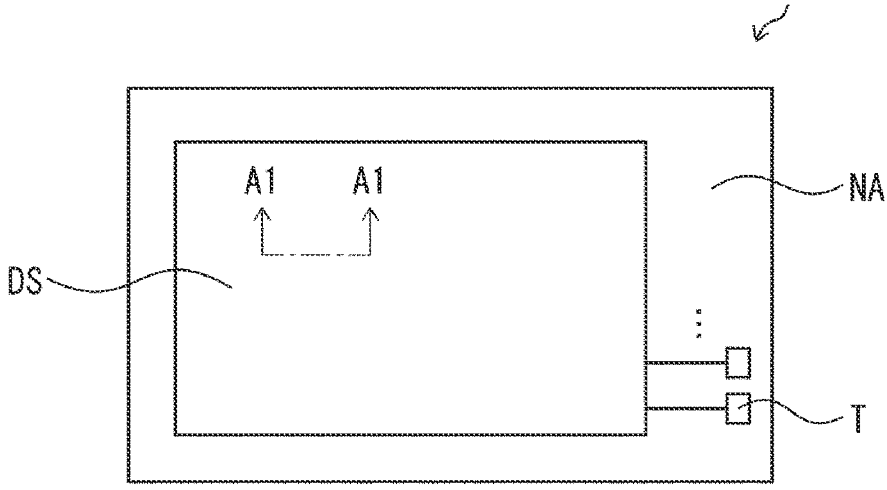
FIG. 2 is a schematic plan view of a display device in accordance with Embodiment 1.
Figure 3:
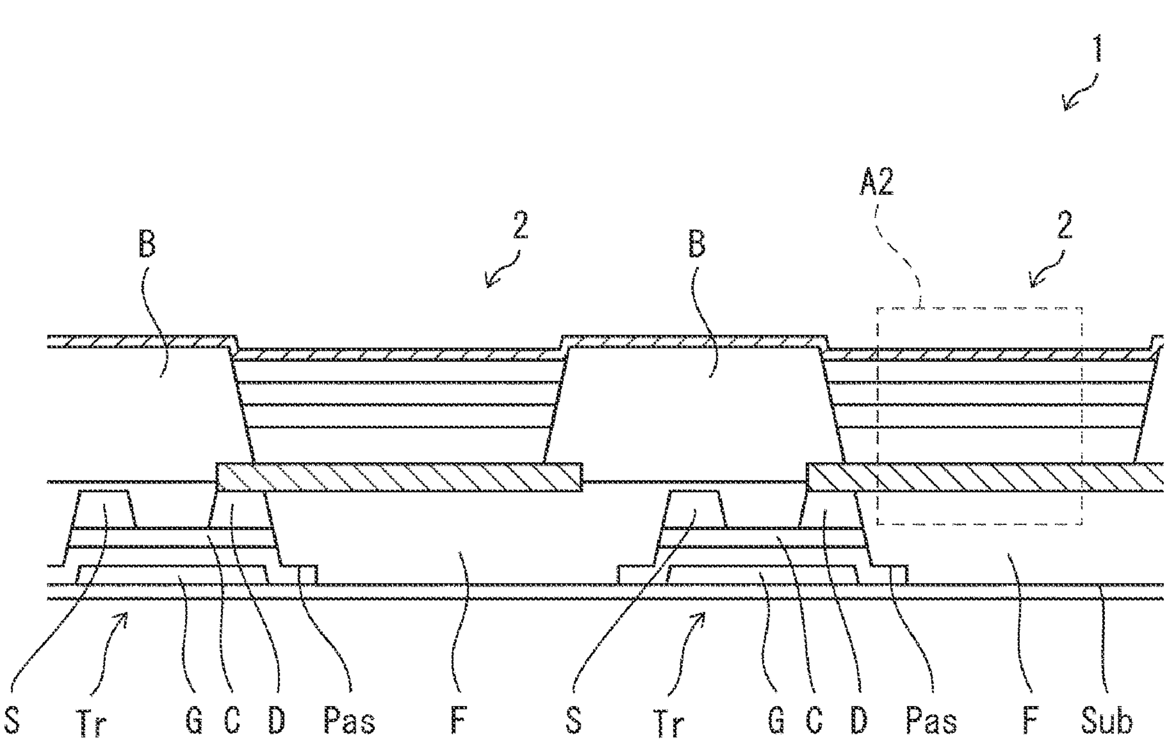
FIG. 3 is an enlarged cross-sectional view of a cross-section of a display area of the display device in accordance with Embodiment 1.
Figure 3:

FIG. 2 is a schematic plan view of a display device 1 in accordance with the present embodiment. FIG. 3 is a schematic cross-sectional view of the display device 1 in accordance with the present embodiment, taken along line A1-A1 indicated in FIG. 2.

Referring to FIG. 2, the display device 1 in accordance with the present embodiment has: a display area DS including a plurality of subpixels and a light-emitting element (detailed later) in each subpixel; and a frame area NA surrounding the display area DS. Terminals T may be provided in the frame area NA to receive signals for driving the light-emitting elements in the display area DS.

Referring to FIG. 3, the display device 1 in accordance with the present embodiment includes: a substrate 3; and light-emitting elements 2, one each in every pixel on the substrate 3. Note that the display device 1 in accordance with the present embodiment includes the plurality of light-emitting elements 2 in locations overlapping the display area DS in a plan view. Alternatively, in a plan view, the substrate 3 may be provided in locations overlapping both the display area DS and the frame area NA, and the terminals T may be provided on the substrate 3. In addition, throughout the specification, the direction from the substrate 3 toward the light-emitting elements 2 in the display device 1 is referred to as "upward," and the direction opposite this "upward" direction is referred to as "downward." Also, throughout the present specification, the "plan view of the display device 1" is a view of the display device 1 when the display device 1 is viewed from above generally in terms of the normal to the top face of the display area DS.

The substrate 3 includes a support substrate Sub, a plurality of thin film transistors Tr, and a planarization film F, all shown in FIG. 3. The support substrate Sub may be, for example, a glass substrate and when the display device 1 is a rigid display device, may be a flexible support film such as a PET film. The plurality of thin film transistors Tr and the planarization film F are provided on the support substrate Sub.

As shown in, for example, FIG. 3, the thin film transistor Tr includes a gate electrode G, a passivation film Pas, and a channel layer C, all of which are stacked in this order. Furthermore, the thin film transistor Tr includes, on the channel layer C, a source electrode S and a drain electrode D that are electrically connected via the channel layer C.

The drain electrodes D are electrically connected respectively to the pixel electrodes (detailed later) of the light-emitting elements 2. The thin film transistor Tr controls the electric current flow from the source electrode S to the drain electrode D via the channel layer C by controlling the voltage applied to the gate electrode G. Hence, the thin film transistors Tr control the light emission by the individual light-emitting elements 2.

The planarization film F is provided to reduce unevenness that is caused on the support substrate Sub by the thin film transistors Tr. The planarization film F may be made of, for example, a polyimide-containing resin.

The light-emitting elements 2 are provided on the substrate 3 and individually separated by a bank B on the substrate 3. The bank B may be made of the same material as the planarization film F and may be made of, for example, a polyimide-containing resin. Note that the display device 1 may further include, on the light-emitting elements 2 and the bank B, for example, either a sealing layer sealing the light-emitting elements 2 for protection from water and other foreign material or a capping layer for improving the efficiency of light extraction from the light-emitting elements 2.

Overview of Light-Emitting Element

Figure 1:
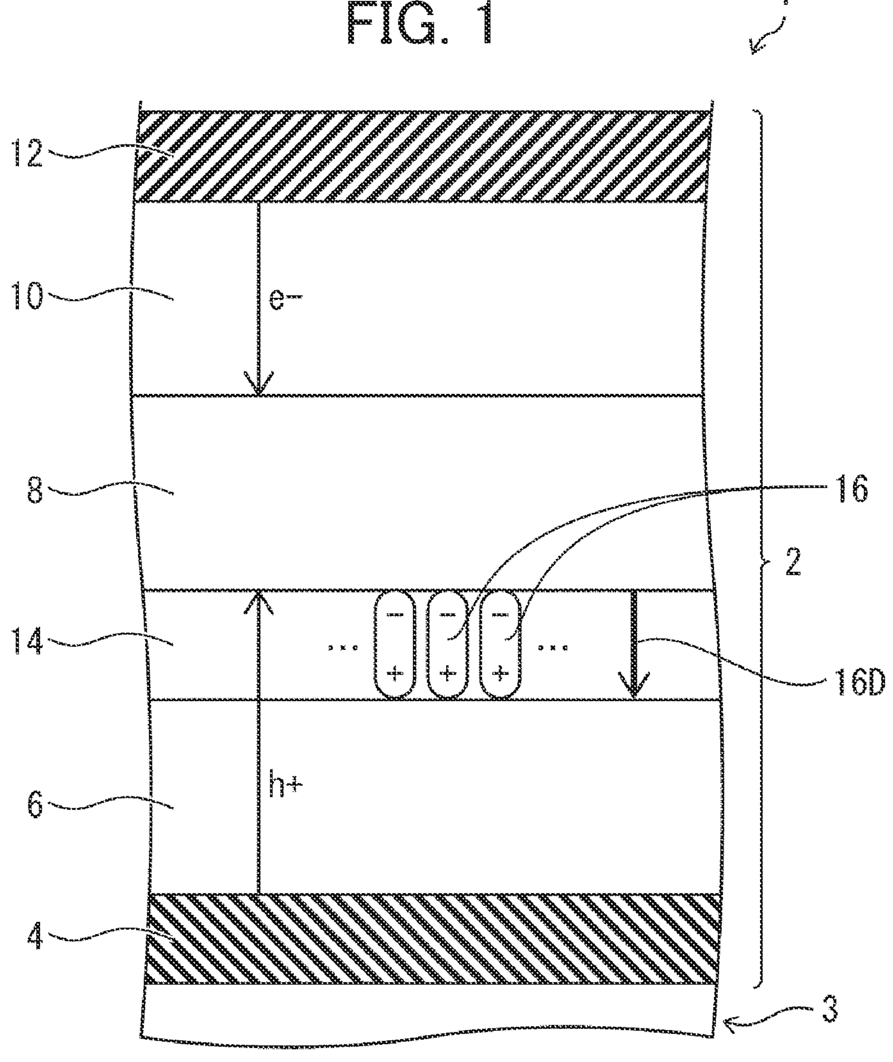
FIG. 1 is an enlarged cross-sectional view of a cross-section of layers in a light-emitting element in accordance with Embodiment 1.

Referring to FIG. 1, a description is now given of the light-emitting element 2 in accordance with the present embodiment. FIG. 1 is an enlarged schematic cross-sectional view of a cross-section of the light-emitting element 2 in accordance with the present embodiment and the surroundings of the light-emitting element 2 in an area A2 indicated by a dotted line in FIG. 3. Specifically, FIG. 1 shows only parts of layers in the light-emitting element 2 and parts of the components overlying the substrate 3 in an enlarged manner.

The light-emitting element 2 in accordance with the present embodiment includes: an anode 4 as a first electrode; a hole transport layer 6 as a first charge transport layer; a light-emitting layer 8; an electron transport layer 10 as a second charge transport layer; and a cathode 12 as a second electrode, all of which are provided in this order when viewed from the substrate 3. The light-emitting element 2 in accordance with the present embodiment further includes a silicide layer 14 between the hole transport layer 6 and the light-emitting layer 8.

Note that in the present embodiment, the hole transport layer 6 and the light-emitting layer 8 are adjacent to each other via the silicide layer 14. In the present specification, the term, two layers being "adjacent," indicates that there exists either a region where the two layers are in contact with each other or a region where the two layers are disposed sandwiching a thin film that has such a small thickness that carriers can tunnel through the thin film or that there exist both of such regions. In other words, when two layers are "adjacent to each other," another layer may be present in a region between the two layers, and no such a layer in another region.

In the present specification, the term, two layers being "adjacent via a particular layer," indicates that each of the two layers is adjacent to this particular layer. In other words, when two layers are "adjacent via a particular layer," a thin film that has such a small thickness that carriers can tunnel through the thin film may be present between each of the two layers and the particular layer. To put it further differently, when two layers are "adjacent via a particular layer," another layer may be present in a region between each of the two layers and the particular layer, and no such a layer in another region.

Note that the light-emitting element 2 in accordance with the present embodiment includes the electron transport layer 10 as described earlier. However, the inclusion of the electron transport layer 10 in the light-emitting element 2 in accordance with the present embodiment is not essential to achieve at least one of the effects detailed later.

Overview of Anode and Cathode

The light-emitting elements 2 in accordance with the present embodiment include the anodes 4, for example, one in each subpixel in the display device 1. In addition, the anode 4 is electrically connected to the drain electrode D of the thin film transistor Tr. Therefore, each light-emitting element 2 is individually driven by the thin film transistor Tr controlling the voltage applied to the anode 4. Therefore, the anode 4 serves as a pixel electrode for the light-emitting element 2. By the thin film transistor Tr driving the light-emitting element 2, holes are injected from the anode 4 to the light-emitting layer 8 side.

The anode 4 contains an electrically conductive material. Specifically, the anode 4 may be, for example, a metal film made of a metal such as Al, Mg, Li, or Ag or of an alloy of any of these metals. The anode 4 may include either a single metal film or a stack of metal films. As a further alternative, the anode 4 may include a thin film of a conductive oxide such as ITO or IZO or a thin film of an oxide semiconductor such as an InGaZnO-based oxide semiconductor.

The cathode 12 is, for example, provided commonly to a plurality of subpixels in the display device 1 and is fed with a constant voltage. Therefore, by the thin film transistor Tr driving the light-emitting element 2 to develop a potential difference between the cathode 12 and the anode 4, electrons are injected from the cathode 12 to the light-emitting layer 8 side. The cathode 12 may contain, for example, the material that may be contained in the anode 4 or the same material as the anode 4.

At least one of the anode 4 and the cathode 12 is transparent so as to transmit at least the light from the light-emitting layer 8. In the light-emitting element 2, light is taken out of the light-emitting layer 8 through at least one of the anode 4 and the cathode 12 that is transparent. One of the anode 4 and the cathode 12 may be reflective to the light from the light-emitting layer 8. This structure enables improving the efficiency of light extraction from the light-emitting element 2.

In the present embodiment, when the anode 4 is transparent and the cathode 12 is reflective to light, the light from the light-emitting element 2 is taken out through the substrate 3 side. By using a transparent material in those members of the substrate 3 that overlap the light-emitting element 2, for example, the support substrate Sub and the planarization film F, the light from each light-emitting element 2 can be taken out through the substrate 3 side of the display device 1. With this structure, the display device 1 functions as a bottom-emission display device.

Meanwhile, when the anode 4 is reflective and the cathode 12 is transparent to light in the present embodiment, the light from the light-emitting element 2 is taken out through the side opposite the substrate 3. With this structure, the display device 1 functions as a top-emission display device where the light from each light-emitting element 2 is taken out through the side opposite the substrate 3. With a view to improving the opening area through which the light from each light-emitting element 2 can be taken out, the display device 1 is preferably a top-emission display device.

Overview of Charge Transport Layer

In the present specification, a charge transport layer has a function of transporting electric charges, that is, either electrons or holes, or both, from each electrode to the light-emitting layer side. A "charge transport layer" refers primarily to either one or both of an electron transport layer and a hole transport layer. The "charge transport layer" may also refer to either one or both of an electron injection layer and a hole injection layer. For example, in the present specification, a "charge transport layer" may refer collectively to an electron transport layer and an electron injection layer, collectively to a hole transport layer and a hole injection layer, or collectively to an electron transport layer, an electron injection layer, a hole transport layer, and a hole injection layer.

The hole transport layer 6 has a function of transporting the holes injected from the anode 4 to the light-emitting layer 8 side. The hole transport layer 6 may contain either an organic material or an inorganic material. When the hole transport layer 6 contains an organic material, this organic material may contain, for example, TFB or PVK. When the hole transport layer 6 contains an inorganic material, this inorganic material may contain, for example, NiO, MgNiO, $Cr_2O_3$, $MoO_3$, or $WO_3$. Besides, the hole transport layer 6 may contain a publicly known, hole-transporting material.

The electron transport layer 10 has a function of transporting the electrons injected from the cathode 12 to the light-emitting layer 8 side. The electron transport layer 10 may contain either an organic material or an inorganic material. When the electron transport layer 10 contains an organic material, this organic material may contain, for example, an aluminum-quinolinolate complex-based compound or a triazole-based compound. When the electron transport layer 10 contains an inorganic material, this inorganic material may contain, for example, ZnO or MgZnO. Besides, the electron transport layer 10 may contain a publicly known, electron-transporting material.

Note that the light-emitting element 2 in accordance with the present embodiment may further include, between the anode 4 and the hole transport layer 6, a hole injection layer that has a function of transporting the holes injected from the anode 4 to the hole transport layer 6. In addition, the light-emitting element 2 may further include, between the cathode 12 and the electron transport layer 10, an electron injection layer that has a function of transporting the electrons injected from the cathode 12 to the electron transport layer 10.

When the light-emitting element 2 includes a hole injection layer, this hole injection layer may contain an oxide of molybdenum (Mo), tungsten (W), vanadium (V), ruthenium (Ru), rhenium (Re), or iridium (Ir). Alternatively, the hole injection layer may contain an oxide of a Group VIIIB (Group 8, Group 9, and Group 10) metal including, for example, nickel (Ni) and palladium (Pd). Additionally, the hole injection layer may contain an oxide of a lanthanoid including, for example, lanthanum (La), cerium (Ce), and neodymium (Nd). Additionally, the hole injection layer may contain an oxide of platinum (Pt), gold (Au), or silver (Ag). Additionally, the hole injection layer may contain a mixture of any of these oxides at any composition ratio. Besides, the hole injection layer may contain polyethylenedioxythiophene polysulfonate (PEDOT:PSS), an organic compound including, for example, starburst amine, or an organic metal compound including, for example, copper phthalocyanine.

Note that throughout the present specification, as described above, when groups of metal elements in the periodic table are denoted by Roman numerals, the denotation follows the defunct CAS numbering system. In addition, throughout the present specification, when groups of metal elements in the periodic table are denoted by Arabic numerals, the denotation follows the current IUPAC numbering system.

Overview of Light-Emitting Layer

The light-emitting layer 8 contains a light-emitting material that emits light through excitation of electrons by recombination of carriers. For example, the holes from the anode 4 and the electrons from the cathode 12 recombine in the light-emitting layer 8 to generate excitons in the light-emitting layer 8. Next, these excitons excite electrons in the light-emitting material to the excited level. Thereafter, the excited electrons in the light-emitting material transition from the excited level to the ground level, causing the light-emitting layer 8 to generate light with a wavelength that corresponds to the energy difference between the excited level and the ground level.

The light-emitting material for the light-emitting layer 8 may contain either an organic light-emitting material or an inorganic light-emitting material. When the light-emitting material for the light-emitting layer 8 contains an organic light-emitting material, this organic light-emitting material may be, for example, an organic light-emitting material used as a light-emitting material in an organic EL element and may be any publicly known organic light-emitting material. In addition, when the light-emitting material for the light-emitting layer 8 contains an inorganic light-emitting material, this inorganic light-emitting material may contain, for example, quantum dots, in other words, semiconductor nanoparticles, that emit light through carrier injection and may be any publicly known inorganic light-emitting material.

The light emitted by the light-emitting layer 8 can be properly designed by altering the type of the light-emitting material contained in the light-emitting layer 8 and altering the wavelength of the light generated by the light-emitting material. For example, the display device 1 may include, as the light-emitting element 2, a red light-emitting element including a red light-emitting layer 8, a green light-emitting element including a green light-emitting layer 8, and a blue light-emitting element including a blue light-emitting layer 8.

When this is the case, in the display device 1, a single pixel may be formed by a red subpixel including a red light-emitting element, a green subpixel including a green light-emitting element, and a blue subpixel including a blue light-emitting element. Hence, the display device 1 is enabled for color display by including an array of a plurality of such pixels in the display area DS.

Overview of Silicide Layer

The silicide layer 14, shown in FIG. 1, contains a plurality of silicides 16. In the present embodiment, the silicides 16 are compounds of a metal element and Si. In particular, in the present embodiment, at least one of the silicides 16 is polar because in the silicide 16, electron clouds are displaced in molecules.

Here, in the present embodiment, at least one of the polar silicides 16 is so positioned that the negatively-charged side of electron cloud in molecules faces the light-emitting layer 8. In other words, the silicide 16 has a dipole moment 16D directed from the light-emitting layer 8 toward the hole transport layer 6.

In particular, in the present embodiment, more than half of the silicides 16 contained in the silicide layer 14 have the dipole moment 16D which is directed from the light-emitting layer 8 toward the hole transport layer 6. Therefore, the silicide layer 14, as a whole, has a dipole moment directed from the light-emitting layer 8 toward the hole transport layer 6.

Note that in the present embodiment, the direction of the dipole moment 16D of the silicide 16 is not limited to a direction shown in FIG. 1 that is parallel to the stack direction of the layers in the light-emitting element 2. Specifically, in the present embodiment, the direction of the dipole moment 16D of the silicide 16 needs only to be any closer to the direction from the light-emitting layer 8 toward the hole transport layer 6 than close to the direction perpendicular to the stack direction of the layers in the light-emitting element 2. In other words, the direction of the dipole moment 16D of the silicide 16 may be off the direction parallel to the stack direction of the layers in the light-emitting element 2.

In the present embodiment, the metal material contained in the silicide 16 may be any suitable metal material that forms a compound with Si. For example, the silicide 16 needs only to have a molecular structure of $MSi_x$ where M is a metal element and x is a real number. In particular, the stoichiometric composition of the silicide 16 may be MSi or $MSi_2$.

Note that in relation to the silicide layer 14, the "layer" and "film" do not necessarily indicate that these "layer" and "film" have an entirely uniform film-like shape in the present specification. For example, the "layer" and "film" containing the silicide 16 may have a discontinuity such as a gap in some parts thereof and refer to a structure that has a verifiable thickness at least in some parts thereof. Note that the silicide layer 14 preferably has a continuous structure. The silicide layer 14 more preferably has an entirely uniform film-like shape.

Method of Manufacturing Light-Emitting Element Up to Hole Transport Layer

Figure 4:
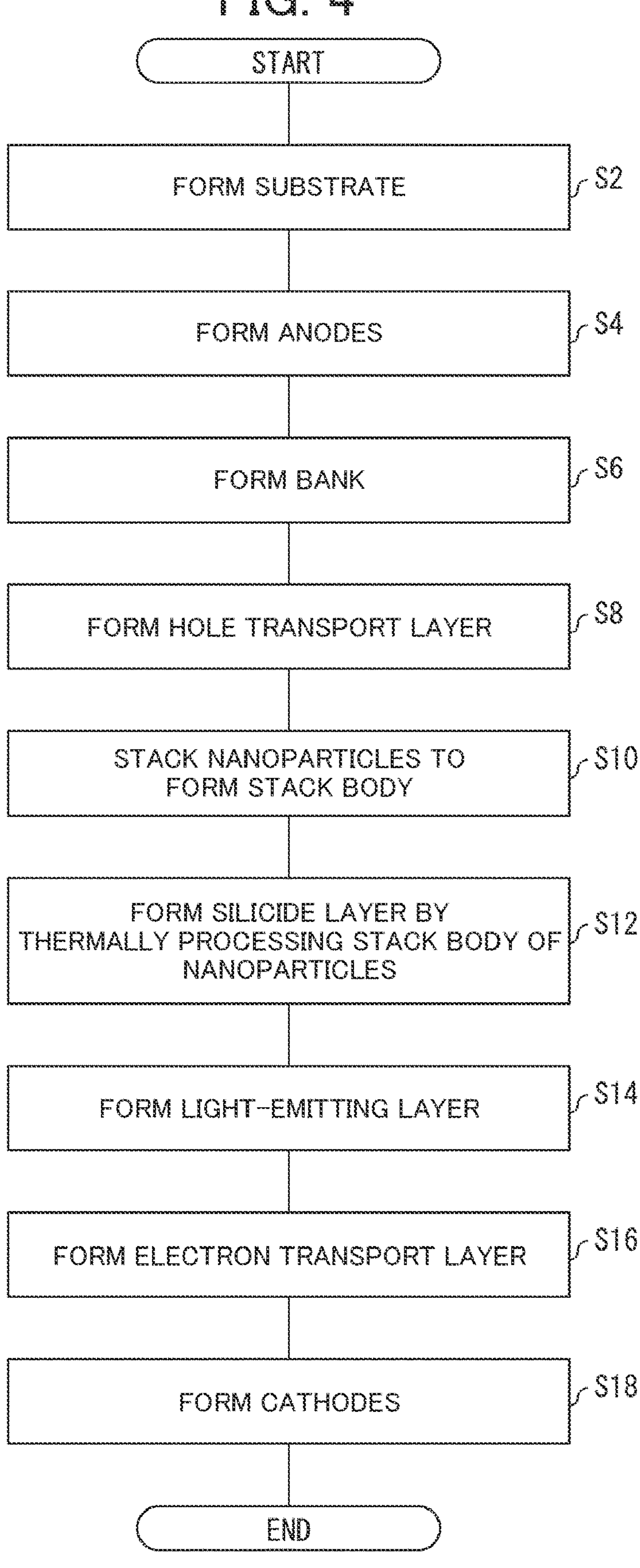
FIG. 4 is a flow chart representing a method of manufacturing a display device in accordance with Embodiment 1.

Referring to FIG. 4, a description is now given of a method of manufacturing the display device 1 in accordance with the present embodiment. FIG. 4 is a flow chart representing a method of manufacturing the display device 1 in accordance with the present embodiment.

In the method of manufacturing the display device 1 in accordance with the present embodiment, first, the substrate 3 is formed (step S2). The substrate 3 is formed by, for example, forming the thin film transistor Tr for each subpixel on the support substrate Sub and thereafter coating with the planarization film F for planarization of the substrate 3.

The thin film transistor Tr may be formed by, for example, alternately repeating the formation of a layer by a publicly known technique including, for example, CVD and sputtering and the patterning of that layer by photolithography. The planarization film F may be formed by, for example, coating with a resin material such as polyimide by a publicly known coating technique such as inkjet printing or spin coating.

Next, the anode 4 is formed on the substrate 3 (step S4). The anode 4 may be formed by a publicly known anode-forming method. Specifically, the anode 4 may be formed by, for example, forming a conductive material-containing layer on the substrate 3 by, for example, CVD, sputtering, or vacuum vapor deposition and thereafter patterning this conductive material-containing layer for each subpixel by, for example, photolithography.

Next, the bank B is formed between subpixels on the substrate 3 (step S6). The bank B may be formed by coating with a resin material such as polyimide by a publicly known coating technique such as inkjet printing or spin coating and then patterning this resin material by, for example, photolithography. Here, the bank B may be formed in locations covering the periphery of the anode 4. In other words, the bank B is patterned so as to expose, from the bank B, at least a part of a portion of the anode 4 that is closer to the center thereof than to the periphery thereof in a plan view of the display device 1.

Next, the hole transport layer 6 is formed (step S8). The hole transport layer 6 may be formed by a publicly known, hole transport layer-forming method. Specifically, the hole transport layer 6 may be formed by, for example, vapor-depositing a hole-transporting material on the subpixels by vacuum vapor deposition using a metal mask that has an opening for each subpixel. Alternatively, the hole transport layer 6 may be formed by coating with a hole-transporting material and thereafter patterning this material for each subpixel by, for example, photolithography or lift-off.

Thermal Process Needed for Silicidation

Next, the silicide layer 14 is formed. The present embodiment takes, as an example, a technique of forming the silicide layer 14 by a thermal process on a metal-Si stack body.

Generally, a thermal process for the silicidation of a metal requires a reaction temperature that is approximately proportional to the melting point of the metal. However, the reaction temperature in silicidation is by far lower than the melting point. Generally, it is known through experimentation that the reaction temperature in silicidation of a metal is equal to, or lower than, one half the metal-Si eutectic temperature. This is because the component element is far more stable when silicidized than as an elementary substance, so that the heat of formation of a silicide is negative and has an absolute value as high as a few hundred kilojoules per mole.

It should be understood that despite of these facts, the silicidation of a bulk metal with bulk Si needs thermal processing at a temperature of approximately a few hundred degrees Celsius. Although combinations do exist that react even at room temperature (e.g., Au), the reaction temperature in silicidation of typical, practically feasible metals is approximately 600° C. or lower in view of cost and environmental factors. For example, the reaction temperature in silicidation of bulk Fe is 340° C., and the reaction temperature in silicidation of bulk Ni is 250° C.

However, if a thermal process is performed at approximately a few hundred degrees Celsius in a step of forming the silicide layer 14, serious damage is inflicted on layers including the substrate 3, the anode 4, and the hole transport layer 6, all formed prior to the silicide layer 14 and hence underlying the silicide layer 14. Therefore, in the present embodiment, it is difficult to employ steps of forming a metal film and a Si film by, for example, sputtering to form a stack body and thereafter heating the stack body to obtain the silicide layer 14.

Step of Forming Stack Body

Accordingly, the present embodiment exploits the fact that metal and Si nanoparticles have a lower melting point than in bulk form. In the step of forming the silicide layer 14, first, metal nanoparticles and Si nanoparticles that are materials for the silicide layer 14 are stacked on each hole transport layer 6 (step S10).

Figure 5:
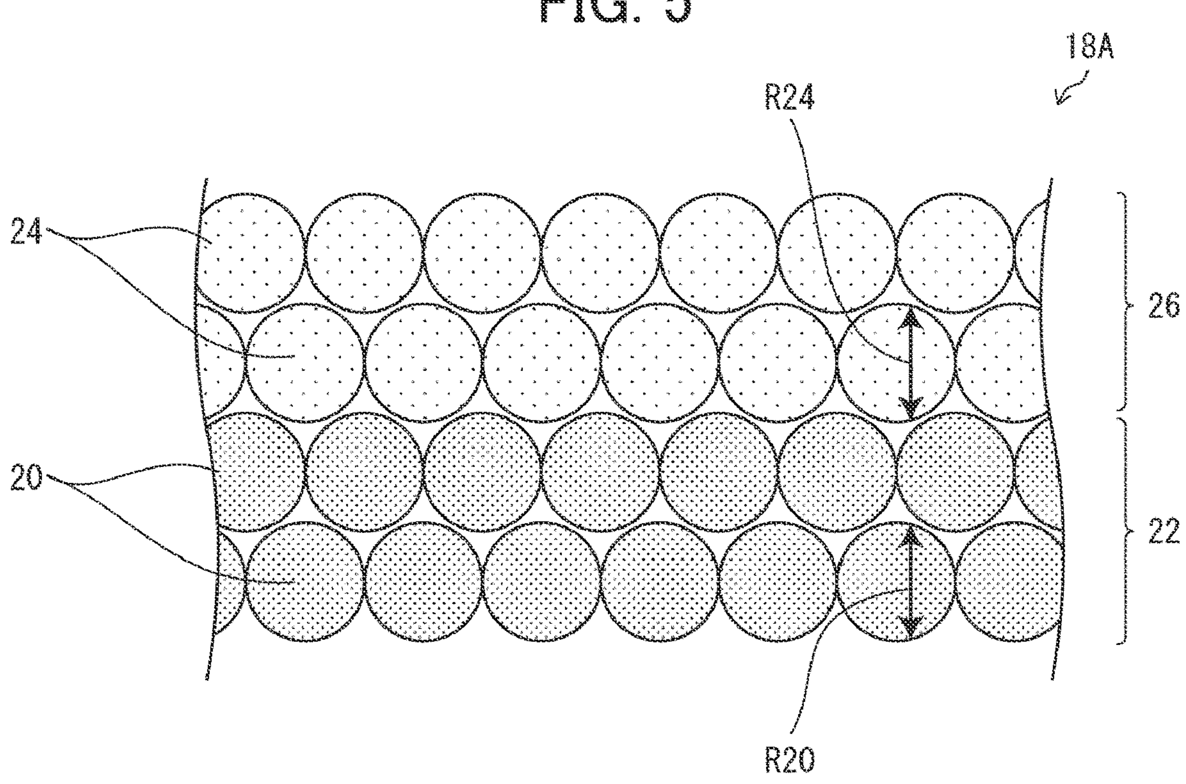
FIG. 5 is an enlarged cross-sectional view of an exemplary cross-section of a stack body formed in a step of forming a silicide layer in accordance with Embodiment 1.

A detailed description is now given of step S10 with reference to FIG. 5. FIG. 5 is a schematic cross-sectional view of a stack body 18A formed in step S10. FIG. 5 only shows a cross-section of the stack body 18A, where the downward direction on the paper is the substrate 3 side of the display device 1.

Referring to FIG. 5, the stack body 18A includes a stack of a metal nanoparticle layer 22 including an array of a plurality of metal nanoparticles 20 and a Si nanoparticle layer 26 including an array of a plurality of Si nanoparticles 24 such that the metal nanoparticle layer 22 and the Si nanoparticle layer 26 are in contact with each other. In particular, the stack body 18A includes the metal nanoparticle layer 22 on the hole transport layer 6 side. The metal nanoparticles 20 are metal nanoparticles contained in the silicide 16, whereas the Si nanoparticles 24 are nanoparticles of Si. Note that neither the metal nanoparticles 20 in the metal nanoparticle layer 22 nor the Si nanoparticles 24 in the Si nanoparticle layer 26 need to be arranged in the regular array shown in FIG. 5.

The metal nanoparticle layer 22 may be formed applying a colloidal solution containing the metal nanoparticles 20 onto the hole transport layer 6. In addition, the Si nanoparticle layer 26 may be formed after forming the metal nanoparticle layer 22, by applying a colloidal solution containing the Si nanoparticles 24 onto the metal nanoparticle layer 22. In the step of forming the metal nanoparticle layer 22 and the Si nanoparticle layer 26, subsequent to the application of each colloidal solution, the colloidal solution may be subjected to, for example, a thermal process of heating at 50° C. for 10 minutes, to vaporize the solvent in the colloidal solution.

Relationship between Particle Diameter and Melting Point of Nanoparticles

Referring to FIG. 5, the metal nanoparticles 20 have a particle diameter R20, whereas the Si nanoparticles 24 have a particle diameter R24. Here, for reasons detailed later, the particle diameter R20 and the particle diameter R24 are preferably less than or equal to 50 nm and more preferably less than or equal to 20 nm.

Figure 6:
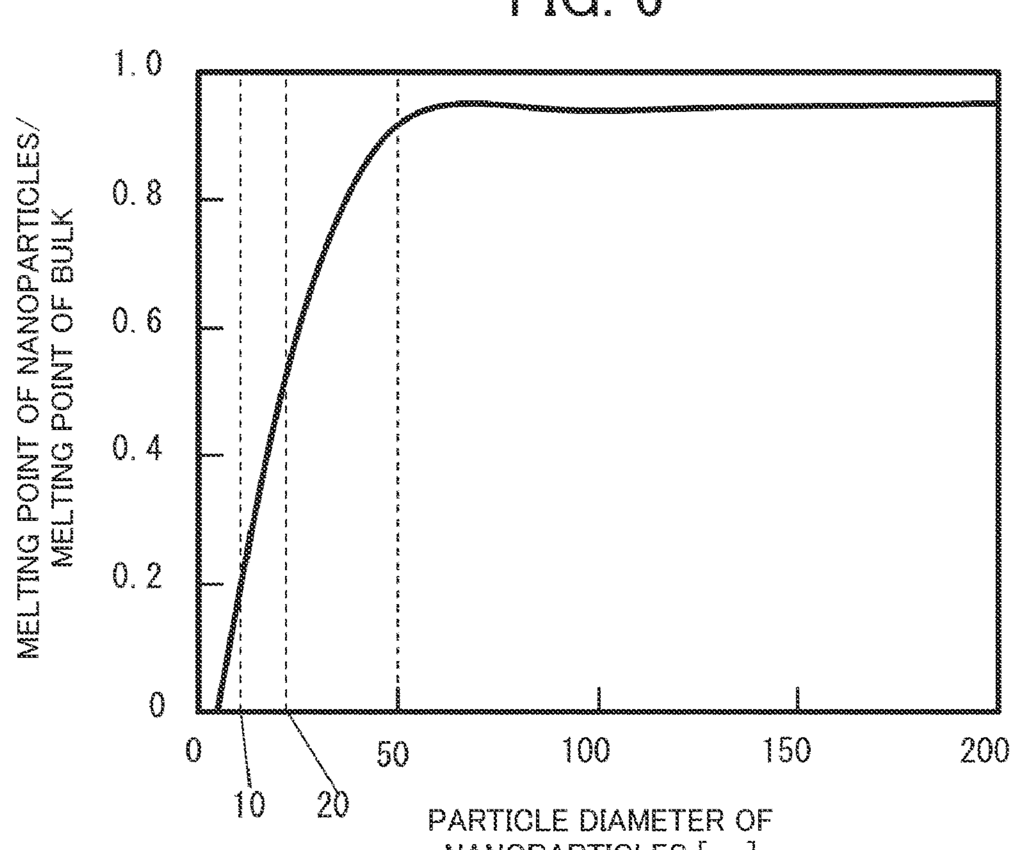
FIG. 6 is a graph representing a relationship the particle diameter of nanoparticles in a stack body and the melting point of the nanoparticles in a silicidation step in accordance with Embodiment 1.

Generally, the reaction temperature in silicidation of nanoparticles varies depending on the melting point of the nanoparticles. Furthermore, generally, the melting point of nanoparticles varies depending also on the particle diameter of the nanoparticles. FIG. 6 is a graph representing a relationship between the melting point and particle diameter of nanoparticles. In FIG. 6, the particle diameter of nanoparticles is plotted on the horizontal axis, and the melting point of the nanoparticles divided by the melting point when the elements of the nanoparticles are in bulk form is plotted on the vertical axis. In other words, the vertical axis indicates the ratio of the melting point of a material in nanoparticle form to the melting point of the material in bulk form.

Note that the values on the vertical axis in FIG. 6 denote the ratios of the melting points of various metals in nanoparticle form and the melting points of the metals in bulk form. Here, the ratios vary depending on the particle diameter of nanoparticles, regardless of the type of the metal. Therefore, the relationship shown in FIG. 6 is generally applicable to various metals.

When the nanoparticles have a particle diameter larger than 50 nm, the melting point of the nanoparticles does not change much irrespective of the particle diameter. However, when the nanoparticles have a particle diameter less than or equal to 50 nm, it is evident that the smaller the particle diameter is, the more the melting point of the nanoparticles decreases when compared with the melting point in bulk form. Furthermore, when the nanoparticles have a particle diameter less than or equal to 20 nm, the melting point of the nanoparticles is less than or equal to approximately 50% of the melting point in bulk form; when the nanoparticles have a particle diameter less than or equal to 10 nm, the melting point of the nanoparticles is less than or equal to approximately 20% of the melting point in bulk form.

Therefore, when the particle diameter R20 and the particle diameter R24 are less than or equal to 50 nm, the melting point of the metal nanoparticles 20 and the Si nanoparticles 24 can be lowered, and the reaction temperature required to silicidize the metal nanoparticles 20 and the Si nanoparticles 24 can in turn be lowered. Furthermore, when the particle diameter R20 and the particle diameter R24 are less than or equal to 20 nm, the reaction temperature required to silicidize the metal nanoparticles 20 and the Si nanoparticles 24 can be further lowered, and damage to the structure underlying the stack body 18A can be sufficiently decreased.

Silicidation Step

Subsequent to step S10, the stack body 18A is subjected to a thermal process to silicidize the metal nanoparticles 20 and the Si nanoparticles 24, thereby forming the silicide 16 and hence forming the silicide layer 14 (step S12). Here, for example, when the particle diameter R20 and the particle diameter R24 are less than or equal to 25 nm, the silicide layer 14 containing the silicide 16 can be formed by subjecting the stack body 18A to a thermal process at approximately 100° C. for 30 minutes to 60 minutes.

Here, in the present embodiment, in the step of heating the stack body 18A, the metal nanoparticle layer 22 in the stack body 18A is positioned closer to the hole transport layer 6 than is the Si nanoparticle layer 26. Therefore, in step S12, the metal nanoparticles 20 are silicidized while being positioned closer to the hole transport layer 6 than is the Si nanoparticles 24. Therefore, the silicide layer 14 is formed so that the metal element in each molecule of the silicide 16 is positioned closer to the hole transport layer 6 than is the Si element.

Figure 7:
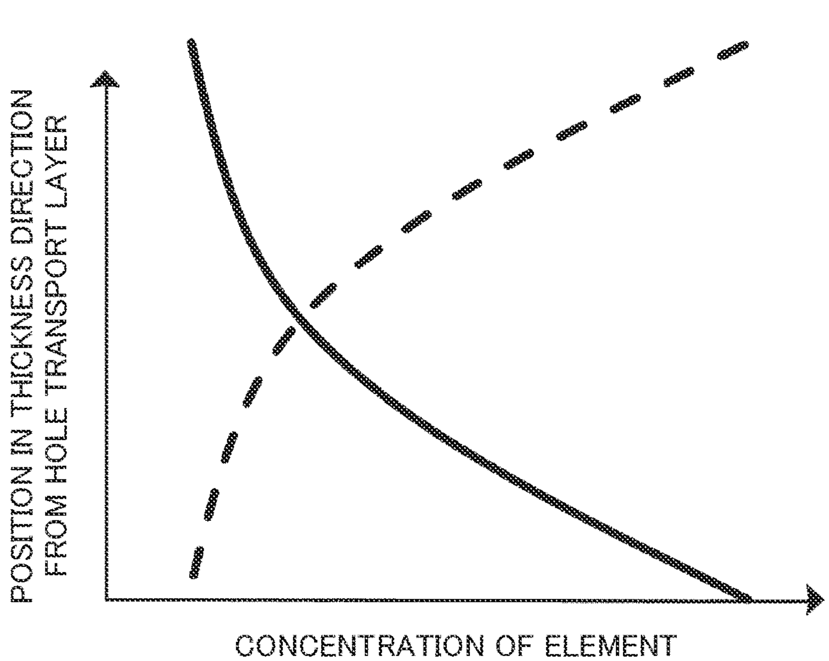
FIG. 7 is a graph representing an exemplary distribution of a concentration of an element in a silicide layer in accordance with Embodiment 1.

The graph in FIG. 7 represents an example of a relationship between a position in the thickness direction from the hole transport layer 6 and the concentration of an element at that position in the silicide layer 14 formed from the stack body 18A. In the graph in FIG. 7, the metal element is represented by a solid line, and the Si element is represented by a dotted line. In addition, in the graph in FIG. 7, the position in the thickness direction from the hole transport layer 6 in the silicide layer 14 is plotted on the vertical axis, and the concentration of each element at that position is plotted on the horizontal axis.

As shown in the graph in FIG. 7, the metal concentration in the silicide layer 14 is higher on the hole transport layer 6 side than on the light-emitting layer 8 side and gradually decreases from the hole transport layer 6 side toward the light-emitting layer 8 side. In contrast, the Si concentration in the silicide layer 14 is lower on the hole transport layer 6 side than on the light-emitting layer 8 side and gradually increases from the hole transport layer 6 side toward the light-emitting layer 8 side.

Metal Element in Silicide

A description is now given of the type of the metal element in the silicide 16 in the silicide layer 14. The polarity or lack of polarity of the silicide 16 and the direction of the dipole moment generated by the polarity change with the metal element in the silicide 16. A description is given of a relationship between the metal element in the silicide 16 and the direction of the dipole moment of the silicide 16 with reference to Table 1 below.

TABLE 1

| Element | | Electrons in d Orbital | Electronegativity | Melting Point (° C.) | Silicide | Direction of Dipole Moment |
|---|---|---|---|---|---|---|
| — | Si | — | 1.9 | 1414 | — | — |
| IVB | Ti | 3d2 | 1.54 | 1668 | $TiSi_2$ | — |
| | Zr | 4d2 | 1.33 | 1855 | $ZrSi_2$ | — |
| | Hf | 5d3 | 1.3 | 2233 | $HfSi_2$ | — |
| VB | V | 3d3 | 1.63 | 1910 | $VSi_2$ | — |
| | Ta | 5d3 | 1.5 | 3017 | $TaSi_2$ | — |
| VIB | Cr | 3d5 | 1.66 | 1907 | $CrSi_2$ | — |
| | Mo | 4d5 | 2.16 | 2613 | $MoSi_2$ | — |
| | W | 5d4 | 2.56 | 3422 | $WSi_2$ | — |
| VIIIB | Fe | 3d6 | 1.83 | 1538 | $FeSi_2$ | M←Si |
| | Ru | 4d7 | 2.2 | 2334 | $RuSi_2$ | M→Si |
| | Os | 5d6 | 2.2 | 3033 | $OsSi_2$ | M→Si |
| | Co | 3d7 | 1.88 | 1495 | $CoSi_2$•CoSi | M←Si |
| | Rh | 4d8 | 2.28 | 1964 | RhSi | M→Si |
| | Ir | 5d7 | 2.2 | 2466 | IrSi | M→Si |
| | Ni | 3d8 | 1.91 | 1455 | $NiSi_2$•NiSi | M←Si |
| | Pd | 4d10 | 2.2 | 1555 | $PdSi_2$•PdSi | M→Si |
| | Pt | 5d9 | 2.28 | 1768 | $PtSi_2$•PtSi | M→Si |

In Table 1, the entries under "Element" are types of metal elements. In the entries under "Element," the group of elements to which the metal belongs in the periodic table is shown together in accordance with the defunct CAS numbering system. The entries under "Electrons in d Orbital" give, for example, "ndm" for a metal element in which the d orbital in the outermost shell is an nd orbital and this nd orbit contains m electrons where n and m are natural numbers indicating the number of electrons contained in the d orbital in the outermost shell of each metal element. The entries under "Electronegativity" give the electronegativity of each metal element. The entries under "Melting Point (° C.)" give the melting point in degrees Celsius of each metal element in bulk form. The entries under "Silicide" give a possible stoichiometric composition of the silicide obtained by silicidation of each metal element. The entries under "Direction of Dipole Moment" give the direction of the dipole moment of the silicide of each metal element when the silicide is polar. The description "M→Si" in the entry under "Direction of Dipole Moment" indicates that the direction of the dipole moment of the silicide is from the metal element toward the Si element. The description "M←Si" in the entry indicates that the direction of the dipole moment of the silicide is from the Si element toward the metal element. If the silicide is a non-polar metal element, the entry under "Direction of Dipole Moment" is empty. Note that Table 1 shows the electronegativity of the Si element and the melting point in bulk form for reference.

Among the metal elements listed in Table 1, none of the silicides of the Group IVB (Group 4), Group VB (Group 5), and Group VIB (Group 6) elements are polar. In contrast, among the metal elements listed in Table 1, all the silicides of the Group VIIIB (Group 8, Group 9, and Group 10) elements are polar. This is because the d orbitals in the outermost shells of the metal elements in Group IVB (Group 4), Group VB (Group 5), and Group VIB (Group 6) have 5 or fewer electrons, and the d orbitals in the outermost shells of the metal elements in Group VIIIB (Group 8, Group 9, and Group 10) have 6 or more electros.

If the outermost shell of one metal atom has 5 or fewer d electrons, the d electrons in the outermost shell are all placed on a bonding orbital on the silicidation of the metal, forming such a good conductor that the silicide is non-polar. However, if the outermost shell of one metal atom has 6 or more d electrons, some of the d electrons in the outermost shell are placed on an antibonding orbital on the silicidation of the metal. The silicide in which an antibonding orbital has an electron forms a band gap, displacing the electron cloud inside the molecule so that the silicide is polar.

In addition, the direction of the dipole moment of a polar silicide is dictated by a difference in electronegativity between the metal element and Si in the silicide. Electronegativity corresponds to the degree of attraction of electrons by the element. The higher the electronegativity, the more easily electrons are attracted to the element. Therefore, in the silicide of a metal element with a lower electronegativity than Si, the electrons inside the molecule are attracted to the Si rather than to the metal element, and the direction of the dipole moment is hence from the Si toward the metal element. In contrast, in the silicide of a metal element with a higher electronegativity than Si, the electrons inside the molecule are attracted to the metal element rather than to the Si, and the direction of the dipole moment is hence from the metal element toward the Si.

In the present embodiment, as shown in FIG. 1, the direction of the dipole moment 16D of the silicide 16 is from the light-emitting layer 8 toward the hole transport layer 6. Additionally, the stack body 18A subjected to a thermal process in step S12 in the present embodiment contains the metal nanoparticles 20 on the hole transport layer 6 side rather than in the Si nanoparticles 24. Therefore, in the silicide 16 formed by thermally processing the stack body 18A, the metal concentration that results from the metal nanoparticles 20 is higher on the hole transport layer 6 side than is the Si concentration that results from the Si nanoparticles 24.

For these reasons, to form, from the stack body 18A, the silicide 16 which has the dipole moment 16D parallel to the direction from the light-emitting layer 8 toward the hole transport layer 6 shown in FIG. 1, the electronegativity of the metal element in the metal nanoparticles 20 needs to be lower than the electronegativity of the Si element. Therefore, with reference to Table 1, at least one of Fe, Co, and Ni can be used as the metal element in the metal nanoparticle layer 22 of the stack body 18A. Note that Ni has almost the same electronegativity as Si. In particular, Ni has a slightly higher electronegativity than Si. However, it is known that Ni silicide generally has a dipole moment directed from Si toward Ni.

Fe, Co, and Ni have a lower melting point than the other metal elements in Group VIIIB (Group 8, Group 9, and Group 10). For this reason, that the metal element in the silicide 16 is Fe, Co, or Ni is preferred in view of lowering the reaction temperature needed to silicidize the stack body 18A to reduce damage to the layers underlying the silicide layer 14. In addition, that the metal element in the silicide 16 is Fe, Co, or Ni is preferred also in view of reducing the cost of the formation of the silicide layer 14 and realizing environmentally friendly manufacturing.

Variation Examples of Stack Body

Figure 8:
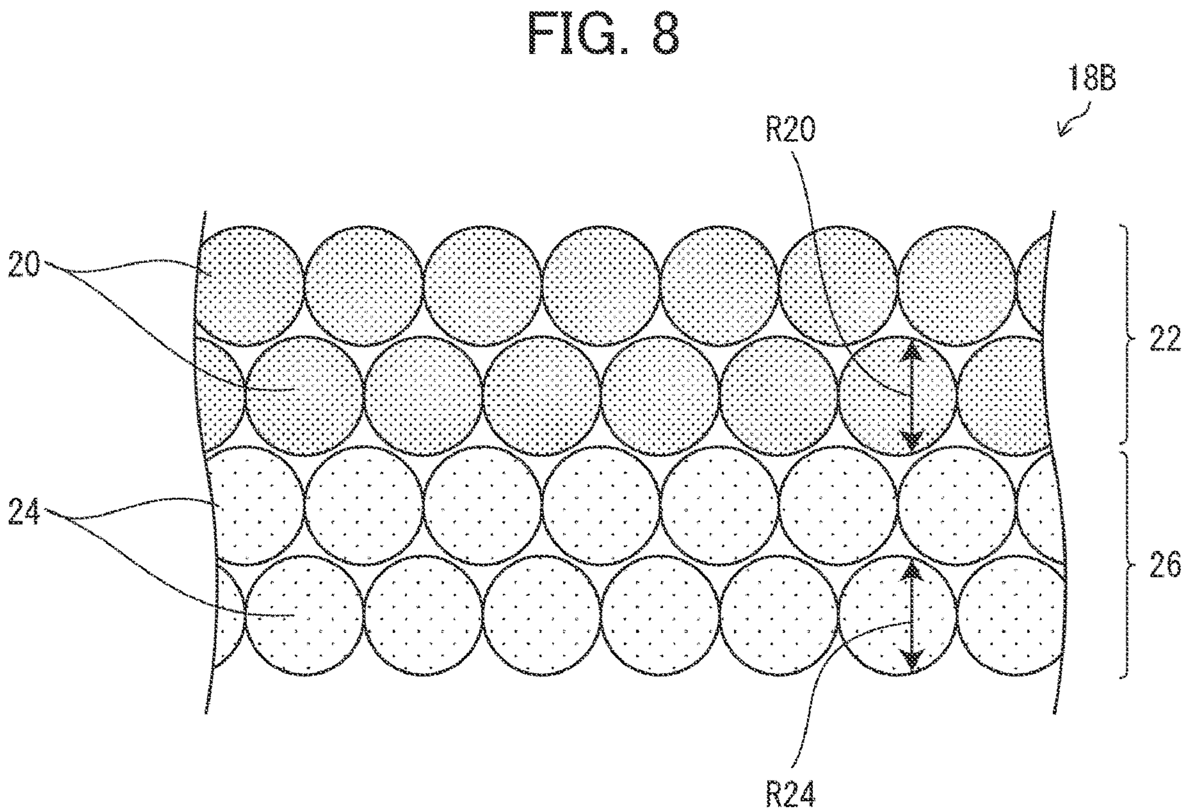
FIG. 8 is an enlarged cross-sectional view of another exemplary cross-section of a stack body formed in a step of forming a silicide layer in accordance with Embodiment 1.

Note that the stack body formed in step S10 does not necessarily have the structure of the stack body 18A shown in FIG. 5. A description is now given of examples of other structures of the stack body formed in step S10 with reference to FIG. 8. FIG. 8 is a schematic cross-sectional view of a stack body 18B that is another example of the stack body formed in step S10. FIG. 8 only shows a cross-section of the stack body 18B, where the downward direction on the paper is the substrate 3 side of the display device 1.

Referring to FIG. 8, the stack body 18B includes a Si nanoparticle layer 26 on the hole transport layer 6 side of the metal nanoparticle layer 22. The metal nanoparticle layer 22 and the Si nanoparticle layer 26 in the stack body 18B may respectively have the same structures as the metal nanoparticle layer 22 and the Si nanoparticle layer 26 in the stack body 18A.

Figures 9, 10:
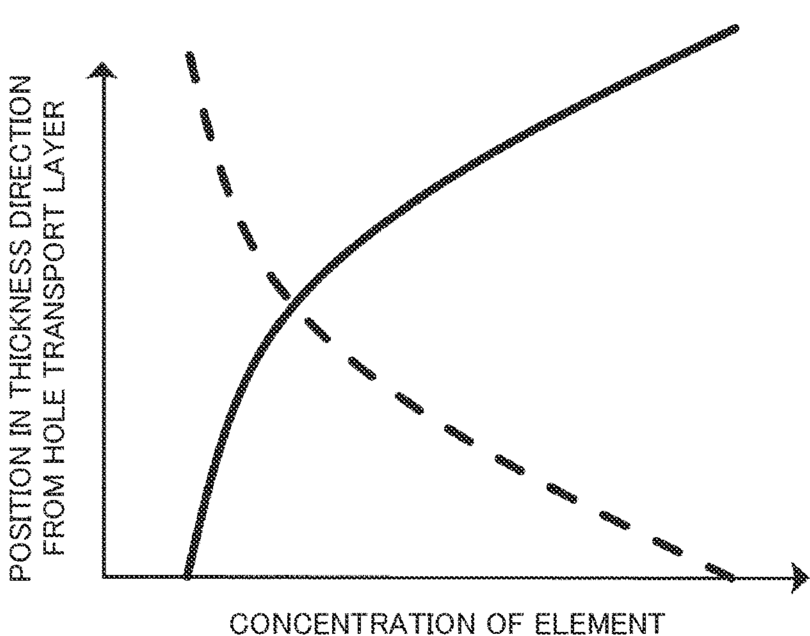
FIG. 9 is a graph representing another exemplary distribution of a concentration of an element in a silicide layer in accordance with Embodiment 1.
FIG. 10 is an enlarged cross-sectional view of a cross-section of layers in a light-emitting element in accordance with a comparative example.

FIG. 9 is a graph representing an example of a relationship between a position in the thickness direction from the hole transport layer 6 and the concentration of an element at that position in the silicide layer 14 formed from the stack body 18B. In the graph in FIG. 9, similarly to the graph in FIG. 7, the metal element is represented by a solid line, and the Si element is represented by a dotted line. In addition, in the graph in FIG. 9, similarly to the graph in FIG. 7, the position in the thickness direction from the hole transport layer 6 in the silicide layer 14 is plotted on the vertical axis, and the concentration of each element at that position is plotted on the horizontal axis.

As shown in the graph in FIG. 9, the metal concentration in the silicide layer 14 is lower on the hole transport layer 6 side than on the light-emitting layer 8 side and gradually increases from the hole transport layer 6 side toward the light-emitting layer 8 side. In contrast, the Si concentration in the silicide layer 14 is higher on the hole transport layer 6 side than on the light-emitting layer 8 side and gradually decreases from the hole transport layer 6 side toward the light-emitting layer 8 side.

The stack body 18B contains the metal nanoparticles 20 on the hole transport layer 6 side rather than in the Si nanoparticles 24. Therefore, in the silicide 16 formed by thermally processing the stack body 18B in step S12, the metal concentration that results from the metal nanoparticles 20 is lower on the hole transport layer 6 side than is the Si concentration that results from the Si nanoparticles 24.

For these reasons, to form, from the stack body 18B, the silicide 16 which has the dipole moment 16D parallel to the direction from the light-emitting layer 8 toward the hole transport layer 6 shown in FIG. 1, the electronegativity of the metal element in the metal nanoparticles 20 needs to be higher than the electronegativity of the Si element. Therefore, with reference to Table 1, at least one of Ru, Os, Rh, Ir, Pd, and Pt can be used as the metal element in the metal nanoparticle layer 22 of the stack body 18B.

Other Example of Silicide Layer Forming Step

In the present embodiment, the silicide layer 14 is not necessarily formed by a technique where step S10 and step S12 described above are sequentially performed. For example, the silicide layer 14 may be obtained by forming the silicide 16 in another step in advance and then forming a thin film of the silicide 16 on the hole transport layer 6 by sputtering using the silicide 16 as a material.

When this is the case, since it becomes difficult to control the direction of the molecules of the silicide 16, the direction of the silicide 16 in the silicide layer 14 is randomly determined. Therefore, the silicide layer 14 formed by the aforementioned technique is overall substantially non-polar regardless of whether or not the silicide 16 is polar.

The silicide layer 14, when formed by sputtering using the silicide 16 as a material, does not need to be subjected to a thermal process for the aforementioned silicidation of the metal nanoparticle layer 22 and the Si nanoparticle layer 26. Therefore, the use of this technique simplifies the step of forming the silicide layer 14 and additionally reduces damage to the layers underlying the silicide layer 14 in the thermal process.

In addition, the metal nanoparticles 20 in the metal nanoparticle layer 22 formed in step S10 may be nanoparticles of a metal element in Group IVB (Group 4), Group VB (Group 5), and Group VIB (Group 6) shown in Table 1. When this is the case, the silicides 16 formed in step S12 are all substantially non-polar, and the silicide layer 14 containing these silicides 16 is therefore overall substantially non-polar.

Furthermore, the stack body 18A or the stack body 18B in the present embodiment may include, instead of the Si nanoparticle layer 26, a $SiO_2$ nanoparticle layer containing a plurality of $SiO_2$ nanoparticles. When this is the case, the thermal process in step S12 removes the 0 from the $SiO_2$ nanoparticles, leaving only the Si that originates in the $SiO_2$ nanoparticles in the silicide 16. Therefore, the silicide layer 14 described above can be obtained from the stack body of the $SiO_2$ nanoparticles and the metal nanoparticles by the same technique as the aforementioned technique.

Method of Manufacturing from Light-emitting Layer to Cathode in Light-emitting Element Subsequent to the formation of the silicide layer 14, the light-emitting layer 8 is formed (step S14). The light-emitting layer 8 may be formed by a publicly known technique including, for example, vapor deposition using a metal mask, photolithography using a photoresist, or lift-off. When the display device 1 includes light-emitting elements 2 that emit light of mutually different colors, the step of forming the light-emitting layer 8 may be repeatedly performed for each color of emission by the light-emitting elements 2 while changing the location where the light-emitting layer 8 is formed and the material for the light-emitting layer 8 for each color of emission.

Next, the electron transport layer 10 is formed (step S16). The electron transport layer 10 may be formed by the same technique as the hole transport layer 6, except for the material used. Next, the cathode 12 is formed (step S18). The cathode 12 may be formed by the same technique as the anode 4, except that the cathode 12 is formed commonly to a plurality of subpixels. It should be understood that when voltage can be applied to the cathode 12 for each subpixel, the cathode 12 may be individually formed for each light-emitting element 2 in the same manner as the anode 4.

The light-emitting element 2 in accordance with the present embodiment is hence formed, which completes the manufacture of the display device 1. Note that subsequent to the step of forming the cathode 12, a capping layer may be formed by, for example, sputtering or a sealing layer may be formed by CVD or coating.

Reducing Carrier Traps by Silicide Layer

A description is now given of the effects achieved by the light-emitting element in accordance with the present embodiment through comparison with a light-emitting element in accordance with a comparative example. FIG. 10 is a schematic cross-sectional view of a light-emitting element 2A in accordance with the comparative example and shows a cross-section at the position corresponding to the schematic cross-sectional view in FIG. 1. The light-emitting element 2A in accordance with the comparative example has the same structure as the light-emitting element 2 in accordance with the present embodiment, except that the light-emitting element 2A includes no silicide layer 14 and includes a hole transport layer 6 and a light-emitting layer 8 that are in direct contact with each other.

In the comparative example, the hole transport layer 6 and the light-emitting layer 8 are in direct contact with each other. Here, the interface portion between the hole transport layer 6 and the light-emitting layer 8 usually has an interfacial energy level. Therefore, carrier traps form at the interface between the hole transport layer 6 and the light-emitting layer 8 in the light-emitting element 2A in accordance with the comparative example. The carrier traps could trap holes transported from the anode 4. Hence, in the light-emitting element 2A in accordance with the comparative example, the concentration of holes transported to the light-emitting layer 8 may fall, negatively affecting the charge-carrier balance in the light-emitting layer 8.

In contrast, the light-emitting element in accordance with the present embodiment includes the silicide layer 14 between the hole transport layer 6 and the light-emitting layer 8. The silicide layer 14 is formed by thermally processing the metal nanoparticle layer 22 and the Si nanoparticle layer 26 at low temperature for silicidation. Therefore, the silicide 16 in the silicide layer 14 has a stable energy level. Therefore, the silicide layer 14 containing the silicide 16 can deactivate the energy level generated at the interface between the hole transport layer 6 and the light-emitting layer 8 which are in contact with the silicide layer 14.

In addition, when the silicide layer 14 is formed by sputtering using the silicide 16 as a material, the resultant silicide layer 14 contains the silicide 16 finely and exhibits a stable energy level. Therefore, even when the silicide layer 14 is formed by sputtering using the silicide 16 as a material, the silicide layer 14 can deactivate the energy level generated at the interface between the hole transport layer 6 and the light-emitting layer 8 which are in contact with the silicide layer 14.

Therefore, the light-emitting element 2 in accordance with the present embodiment reduces the carrier traps formed at the interface between the hole transport layer 6 and the silicide layer 14 and at the interface between the silicide layer 14 and the light-emitting layer 8, thereby improving the efficiency of hole injection to the light-emitting layer 8. Therefore, the light-emitting element 2 in accordance with the present embodiment, since being capable of improving the efficiency of carrier injection to the light-emitting layer 8, can improve the overall luminous efficiency of the element.

The display device 1 including a plurality of such light-emitting elements 2 with improved luminous efficiency can more efficiently produce displays owning to the light-emitting elements 2 and hence reduces power consumption. In addition, since the luminous efficiency of the light-emitting elements 2 is improved, the display device 1 can reduce the voltage applied to each light-emitting element 2 and at the same time produce high luminance displays. Therefore, the display device 1 can reduce the shortening of the lifetime of the light-emitting elements 2 that inevitably occurs as a result of driving the light-emitting elements 2 at high voltage.

Structure of Silicide Layer

When the silicide layer 14 is formed by thermally processing the metal nanoparticle layer 22 and the Si nanoparticle layer 26, the metal nanoparticle layer 22 and the Si nanoparticle layer 26 may be substantially completely silicidized. When this is the case, the silicide layer 14 is a continuous film of the silicide 16. Hence, the silicide layer 14 efficiently restrains the hole transport layer 6 and the light-emitting layer 8 from being in direct contact with each other without the intervening silicide 16. Therefore, the silicide layer 14, which is a continuous film of the silicide 16, more efficiently reduces the carrier traps formed between the hole transport layer 6 and the light-emitting layer 8.

In addition, when the silicide layer 14 is formed by sputtering the silicide 16, the silicide layer 14 may contain a silicide 16 that has a columnar structure or a particulate structure.

When the silicide layer 14 is formed by sputtering the silicide 16, if the silicide 16 that has been flown onto the hole transport layer 6 has high energy, this silicide 16 moves on the hole transport layer 6 over a relatively long distance even after the silicide 16 reaches the hole transport layer 6. The silicide 16 will be acquired in an increasingly stable location on the hole transport layer 6 as the silicide 16 moves over a longer distance on the hole transport layer 6.

Specifically, if the silicide 16 moves over a long distance on the hole transport layer 6, this silicide 16 will be preferentially acquired by defects in the silicide layer 14 that is being formed. In other words, the silicide layer 14 develops fewer defects and becomes finer as the silicide 16 moves over a longer distance on the hole transport layer 6.

Here, it is well known that the silicide layer 14 formed under such conditions that the silicide 16 flown onto the hole transport layer 6 has high energy contains silicide 16 that has a columnar structure or a particulate structure. Therefore, the silicide layer 14 containing the silicide 16 with a columnar structure or a particulate structure is a fine film with fewer defects. Therefore, since defects where carrier traps can be formed are reduced, the silicide layer 14 containing the silicide 16 with a columnar structure or a particulate structure improves the efficiency of hole transport from the hole transport layer 6 to the light-emitting layer 8.

Note that the specific structure of, the presence/absence of polarity in, and the direction of the dipole moment 16D of, the silicide 16 in the silicide layer 14 can be checked by, for example, obtaining a diffraction image of electron beams passing through the silicide layer 14 by CBED (convergent beam electron diffraction). CBED is one of modes of the transmission electron microscope where electron beams are converged onto a sample to obtain a diffraction image. When an electron beam passes through the silicide layer 14, the diffraction image of this electron beam is modulated in accordance with the density distribution of the electrons in the silicide layer 14. Therefore, the diffraction image shows contrast in accordance with the electron density of the silicide layer 14. Thus, the electron density distribution corresponding to the dipole moment of the silicide layer 14 can be determined by analyzing contrast in the diffraction image. Note that the diffraction image of the transmitted electron beam obtained by CBED has a resolution corresponding to the lattice length of the silicide molecule. Therefore, a cross-sectional image of the silicide layer 14 can be obtained by CBED.

Effects Achieved by Polarity of Silicide

Figure 11:
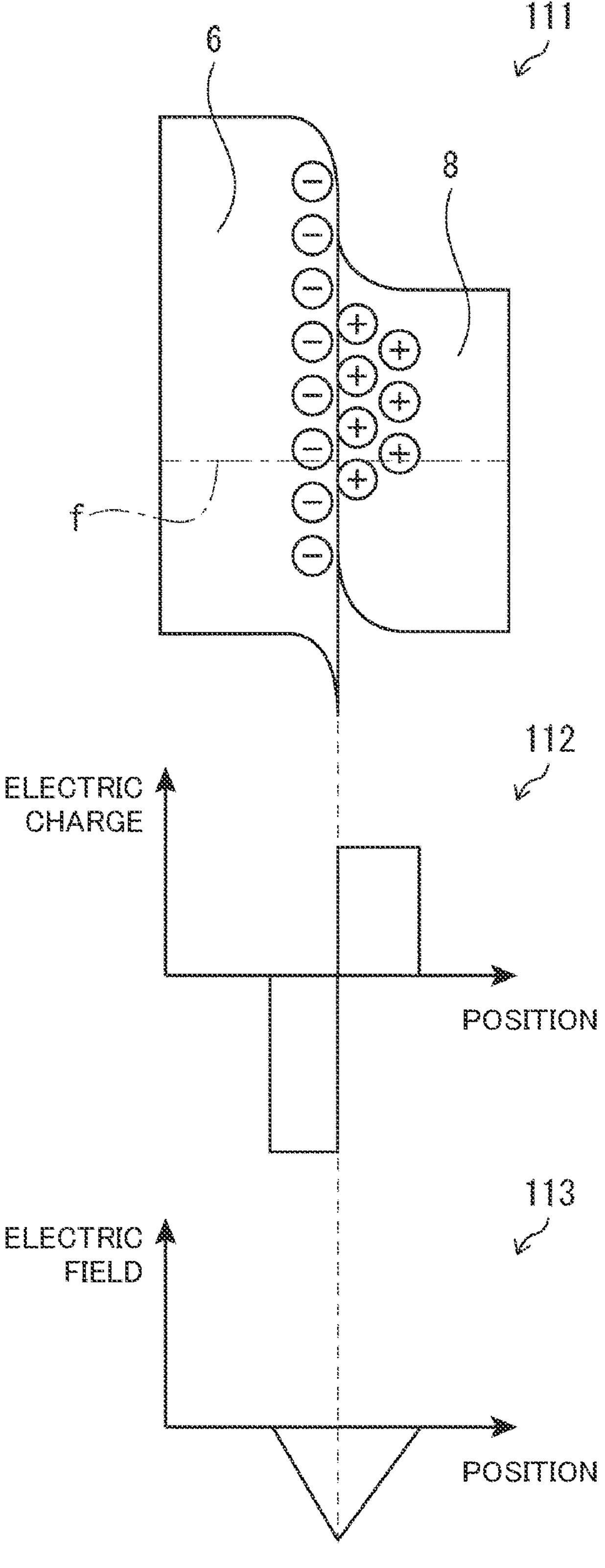
FIG. 11 is a schematic energy band diagram, a schematic electric charge distribution graph, and a schematic electric field graph for a hole transport layer and a light-emitting layer, prepared to illustrate problems with the light-emitting element in accordance with the comparative example.
Figure 12:
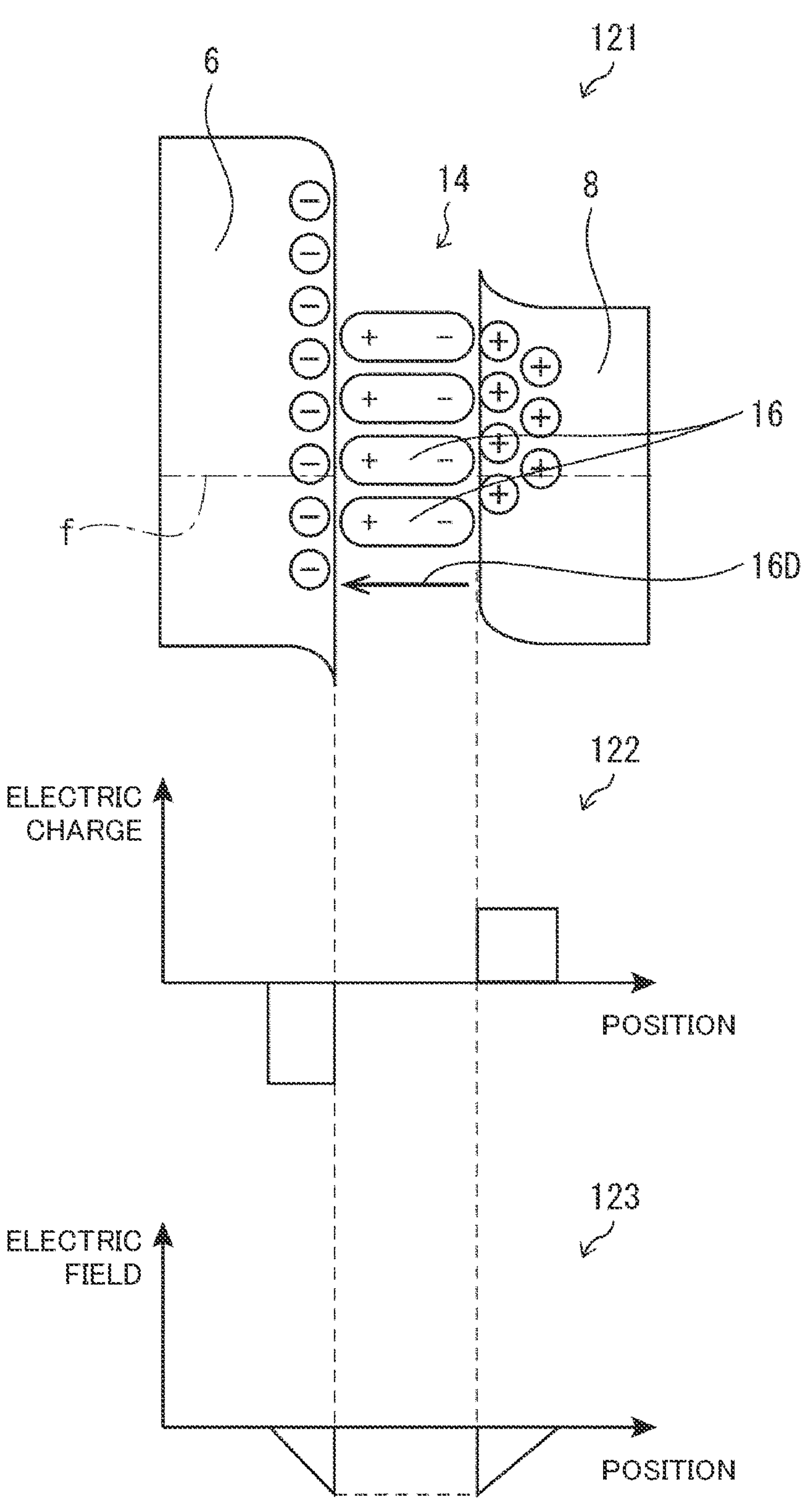
FIG. 12 is a schematic energy band diagram, a schematic electric charge distribution graph, and a schematic electric field graph for a hole transport layer, a silicide layer, and a light-emitting layer, prepared to illustrate the effects of the light-emitting element in accordance with Embodiment 1.

A description is now given of the effects further achieved by the light-emitting element in accordance with the present embodiment with reference to FIGS. 11 and 12.

FIG. 11 shows a schematic energy band diagram 111 representing the condition of the energy bands of the hole transport layer 6 and the light-emitting layer 8 in the light-emitting element 2A in accordance with the comparative example. In the comparative example, the hole transport layer 6 and the light-emitting layer 8 are in contact with each other. Therefore, the energy bands of the hole transport layer 6 and the light-emitting layer 8 bend so that the Fermi level f of the hole transport layer 6 can match the Fermi level f of the light-emitting layer 8 as shown in the energy band diagram 111.

These bends in the energy bands result from movement of carriers in the hole transport layer 6 and the light-emitting layer 8. Specifically, in the hole transport layer 6, electrons move to a neighborhood of the interface with the light-emitting layer 8. In the light-emitting layer 8, holes move to a neighborhood of the interface with the hole transport layer 6.

Here, the electric charge distribution in the hole transport layer 6 and the light-emitting layer 8 and the electrical potential generated in the hole transport layer 6 and the light-emitting layer 8 due to this electric charge distribution are schematically shown in the graphs 112 and 113 in FIG. 11. The graph 112 schematically represents an electric charge distribution in the hole transport layer 6 and the light-emitting layer 8 in accordance with the comparative example. The graph 113 schematically represents the intensity of an electric field generated in the hole transport layer 6 and the light-emitting layer 8 in accordance with the comparative example.

The graph 112 and the graph 113 show a position in the thickness direction of each layer in the light-emitting element 2 from the anode 4 side on the horizontal axis. The graph 112 shows the quantity of electric charge at the position on the vertical axis, the quantity being given a positive value when there is a distribution of holes and a negative value when there is a distribution of electrons. The graph 113 shows the intensity of an electric field generated at the position on the vertical axis with the direction from the light-emitting layer 8 toward the hole transport layer 6 being given a positive value. Note that the positions on the horizontal axes in the graph 112 and the graph 113 correspond to the positions shown in the energy band diagram 111.

As shown in the graph 112, the net electric charge of the electrons that have moved to a neighborhood of the interface of the hole transport layer 6 with the light-emitting layer 8 generally matches the net electric charge of the holes that have moved to a neighborhood of the interface of the light-emitting layer 8 with the hole transport layer 6. However, the distribution of holes in the light-emitting layer 8 is more broadly spread from the interface with the hole transport layer 6 than does the distribution of electrons in the hole transport layer 6 from the interface with the light-emitting layer 8. This is because the hole transport layer 6 has a higher carrier density than does the light-emitting layer 8 and in contrast, the light-emitting layer 8 is almost intrinsic.

Therefore, as shown in the graph 113, the intensity of the electric field generated in the hole transport layer 6 near the interface with the light-emitting layer 8 and directed from the hole transport layer 6 toward the light-emitting layer 8 increases. As a result of this, the band gap at the interface of the hole transport layer 6 with the light-emitting layer 8 significantly bends toward the low energy end as shown in the energy band diagram 111.

Therefore, in the light-emitting element 2A in accordance with the comparative example, the barrier to the injection of holes from the hole transport layer 6 to the light-emitting layer 8 is raised at the interface between the hole transport layer 6 and the light-emitting layer 8. Therefore, in the light-emitting element 2A in accordance with the comparative example, the efficiency of hole injection to the light-emitting layer 8 decreases, thereby reducing the hole concentration in the light-emitting layer 8 and hence degrading the charge-carrier balance in the light-emitting layer 8, which leads to decreases in the luminous efficiency of the light-emitting element 2A.

FIG. 12 shows a schematic energy band diagram 121 representing the condition of the energy bands of the hole transport layer 6 and the light-emitting layer 8 in the light-emitting element 2 in accordance with the present embodiment. A graph 122 schematically represents an electric charge distribution in the hole transport layer 6, the silicide layer 14, and the light-emitting layer 8 in accordance with the present embodiment. A graph 123 schematically represents the intensity of an electric field generated in the hole transport layer 6, the silicide layer 14, and the light-emitting layer 8 in accordance with the present embodiment.

Note that in the present embodiment, the silicide layer 14 resides between the hole transport layer 6 and the light-emitting layer 8. Therefore, the energy band diagram 121, the graph 122, and the graph 123 show a space corresponding to the silicide layer 14 between the hole transport layer 6 and the light-emitting layer 8 for convenience of description. In addition, the definition of each axis in the graph 122 and the graph 123 corresponds to the definition of each axis in the graph 112 and the graph 113.

In the present embodiment, the silicide 16 in the silicide layer 14 is so formed that the direction of the dipole moment 16D of the silicide 16 is from the light-emitting layer 8 toward the hole transport layer 6. Therefore, the silicide 16 is so formed that the electron cloud is positively charged on the hole transport layer 6 side and negatively charged on the light-emitting layer 8 side.

As a result of this, electric charges effectively cancel out between the electrons that have moved to the light-emitting layer 8 side of the hole transport layer 6 and the electron cloud positively charged on the hole transport layer 6 side of the silicide 16. Therefore, as shown in the graph 122, the effective quantity of charge decreases over the comparative example both near the interface of the hole transport layer 6 with the light-emitting layer 8 and near the interface of the light-emitting layer 8 with the hole transport layer 6.

As a result of this, as shown in the graph 123, the intensity of the electric field generated near the interface of the hole transport layer 6 with the light-emitting layer 8 and directed from the hole transport layer 6 toward the light-emitting layer 8 is lower than in the comparative example. Therefore, as shown in the energy band diagram 121, the bend of the band gap at the interface of the hole transport layer 6 with the light-emitting layer 8 toward the low energy end is also reduced in comparison with the comparative example. Consequently, in above-mentioned structure, the barrier to the holes injected from the hole transport layer 6 to the light-emitting layer 8 is lowered.

Therefore, in the light-emitting element 2 in accordance with the present embodiment, the barrier to the holes injected from the hole transport layer 6 to the light-emitting layer 8 is lowered at the interface between the hole transport layer 6 and the light-emitting layer 8. As a result, in the light-emitting element 2 in accordance with the present embodiment, the efficiency of hole injection to the light-emitting layer 8 is improved, the concentration of holes in the light-emitting layer 8 rises, and the luminous efficiency of the light-emitting element 2 is improved.

Note that when the silicide 16 in the silicide layer 14 is partially polar, the direction of the polarity of the silicide 16 may not be controlled, and the direction may be randomly determined. Even in such a case, the silicide 16 aligns owing to the spontaneous polarization of the silicide 16 when the silicide layer 14 is placed under an intense external electric field. Hence, even in the silicide layer 14 in which the silicide 16 is partially polar, the efficiency of hole injection to the light-emitting layer 8 is advantageously improved if the light-emitting element 2 is driven at a high voltage. Therefore, the light-emitting element 2 including the silicide layer 14 in which the silicide 16 is partially polar exhibits an improved luminous efficiency when driven for high luminance.

Supplementary Description

When the silicide 16 has a molecular structure of $MSi_x$ as described above where M is a metal element and x is a real number, and this silicide 16 has a stoichiometric composition of MSi, x may be such that $0.8 \le x \le 1.2$. In addition, when the silicide 16 has a stoichiometric composition of $MSi_2$, x may be such that $1.6 \le x \le 2.4$.

When the molecules of the silicide 16 contain an element the quantity of which exceeds ±20% of the stoichiometric composition, the resultant silicide 16 could be non-polar under the influence of the conduction of the metal and Si in the silicide 16. Therefore, when x falls in the aforementioned value range, the formation of the non-polar silicide 16 can be restrained.

In addition, the silicide layer 14 may have a thickness of less than or equal to 20 nm. Such a thickness restrains increases in the overall electricity resistance of the light-emitting element 2. Furthermore, when the silicide 16 in the silicide layer 14 is non-polar, the silicide layer 14 may have a thickness of less than or equal to 5 nm. Such a thickness enables carriers to efficiently pass through the silicide layer 14 by tunnelling effect even in the absence of the advantageous lowering of the injection barrier to carriers moving to the light-emitting layer 8 achieved by the polarity of the silicide 16 in the silicide layer 14.

In addition, as shown in FIG. 7 or 9, the metal concentration and the Si concentration in the silicide layer 14 may differ from position to position in the thickness direction. When this is the case, the direction of the dipole moment 16D of the silicide 16 can be more efficiently controlled by suitably designing the metal concentration and the Si concentration at each position.

Embodiment 2

Reversing Dipole Moment

Figure 13:
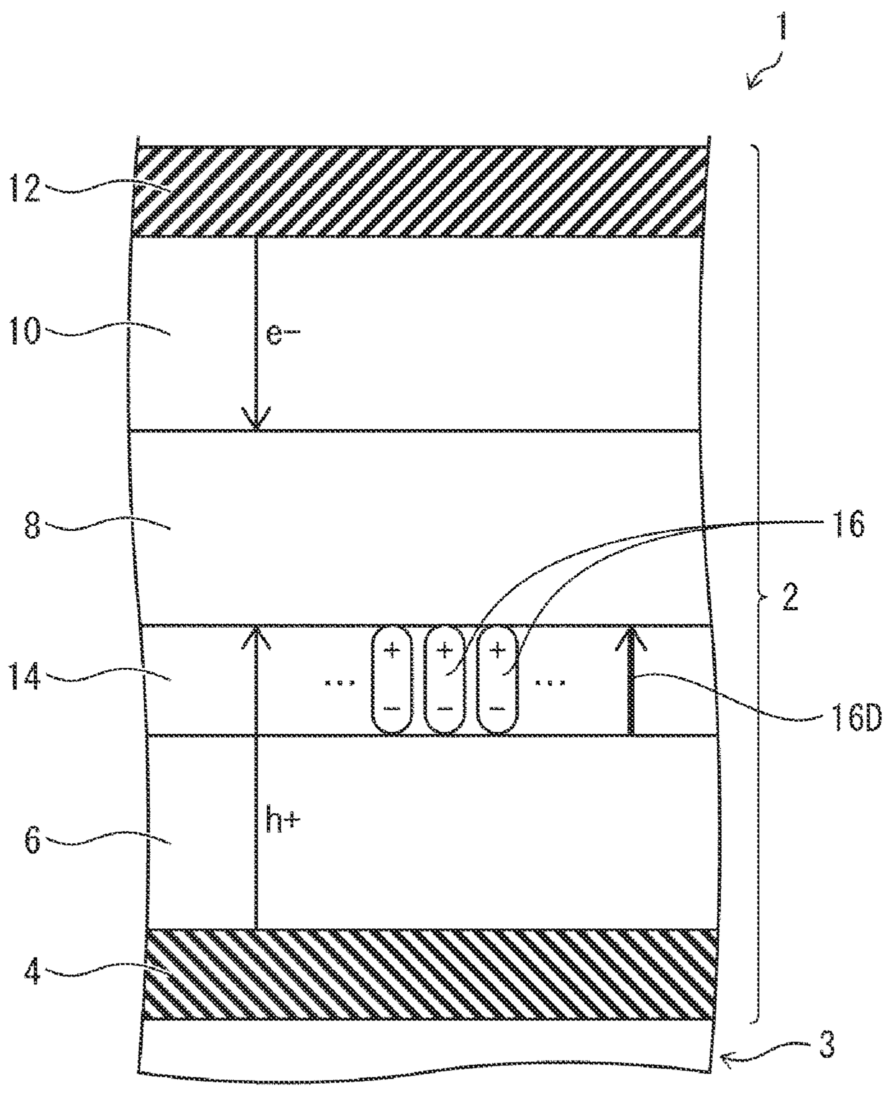
FIG. 13 is an enlarged cross-sectional view of a cross-section of layers in a light-emitting element in accordance with Embodiment 2.

FIG. 13 is an enlarged schematic cross-sectional view of a cross-section of a light-emitting element 2 in accordance with the present embodiment and the surroundings of the light-emitting element 2, taken at the position corresponding to the cross-section shown in FIG. 1. Note that those members which have the same function are given the same name and reference numeral throughout the present specification, and description thereof is not repeated unless the members have different structures.

The display device 1 in accordance with the present embodiment differs from the display device 1 in accordance with the preceding embodiment in the direction of the dipole moment 16D of the silicide 16 in the silicide layer 14 of the light-emitting element 2. In particular, in the present embodiment, at least one of the polar silicides 16 is so positioned that the negatively-charged side of the electron cloud inside the molecule faces the hole transport layer 6. In other words, the silicide 16 has a dipole moment 16D directed from the hole transport layer 6 toward the light-emitting layer 8.

In particular, in the present embodiment, more than half of the silicides 16 contained in the silicide layer 14 have the dipole moment 16D which is directed from the hole transport layer 6 toward the light-emitting layer 8. Therefore, the silicide layer 14, as a whole, has a dipole moment directed from the hole transport layer 6 toward the light-emitting layer 8.

Except for these respects, the display device 1 in accordance with the present embodiment has the same structure as the display device 1 in accordance with the preceding embodiment.

The display device 1 in accordance with the present embodiment is manufactured by the same method as the method of manufacturing the display device 1 in accordance with the preceding embodiment. It should be understood that in the present embodiment, when the stack body 18A is formed in step S10, the metal nanoparticles 20 are selected from, for example, Group IVB (Group 4), Group VB (Group 5), and Group VIB (Group 6) metal elements listed in Table 1. In addition, in the present embodiment, when the stack body 18B is formed in step S10, the metal nanoparticles 20 are selected from, for example, Group VIIIB (Group 8, Group 9, and Group 10) metal elements listed in Table 2. Hence, the silicide layer 14 containing the silicide 16 with the dipole moment 16D directed from the hole transport layer 6 toward the light-emitting layer 8 can be formed by the same method as the method of forming the silicide layer 14 in the preceding embodiment.

Also in the present embodiment, the energy level of the silicide 16 in the silicide layer 14 is stable. Therefore, the light-emitting element 2 in accordance with the present embodiment reduces the carrier traps formed at the interface between the hole transport layer 6 and the silicide layer 14 and at the interface between the silicide layer 14 and the light-emitting layer 8. Therefore, the light-emitting element 2 in accordance with the present embodiment improves the efficiency of hole injection to the light-emitting layer 8, thereby improving the overall luminous efficiency of the element.

Furthermore, unlike the light-emitting element 2 in accordance with the preceding embodiment, the light-emitting element 2 in accordance with the present embodiment includes the silicide 16 the dipole moment 16D of which is directed from the hole transport layer 6 toward the light-emitting layer 8. Therefore, for the reasons described in the preceding embodiment with reference to FIG. 12, the light-emitting element 2 in accordance with the present embodiment has a raised barrier to the holes injected from the hole transport layer 6 to the light-emitting layer 8.

Depending on the design of the light-emitting element 2, the efficiency of electron transport from the cathode 12 to the light-emitting layer 8 may be low, the concentration of holes in the light-emitting layer 8 may increase, and the light-emitting layer 8 may lose a good charge-carrier balance. When this is the case, the raised barrier to the holes injected from the hole transport layer 6 to the light-emitting layer 8 lowers the concentration of holes in the light-emitting layer 8, thereby improving the balance with the concentration of electrons. Therefore, the light-emitting element 2 in accordance with the present embodiment exhibits improved luminous efficiency by reducing excess holes in the light-emitting layer 8 and hence improving the charge-carrier balance.

In the present embodiment, when the silicide layer 14 is formed by thermally processing the metal nanoparticle layer 22 and the Si nanoparticle layer 26, the metal nanoparticle layer 22 and the Si nanoparticle layer 26 may be only partially silicidized. In particular, in the silicide layer 14, the metal nanoparticle layer 22 and the Si nanoparticle layer 26 may be silicidized in locations where the metal nanoparticle layer 22 and the Si nanoparticle layer 26 are in contact with either one or both of the light-emitting layer 8 and the electron transport layer 10. This structure enables restraining the generation of an interfacial energy level, thereby restraining the formation of carrier traps, at least in portions where the metal nanoparticle layer 22 or the Si nanoparticle layer 26 is in contact with the light-emitting layer 8 or the electron transport layer 10.

In such a case, the silicide layer 14 includes a collective structure of nanoparticles of the silicide 16 in contact with either one or both of the light-emitting layer 8 and the electron transport layer 10. Hence, in the silicide layer 14, the nanoparticles of the silicide 16 can cover the surface of either one or both of the light-emitting layer 8 and the electron transport layer 10 with no gaps between the nanoparticles. This particular structure renders the electrical contacts between the nanoparticles of the silicide 16 point-to-point contacts, thereby lowering the transport rate of electrons between the silicide 16. Therefore, the silicide layer 14, with the aforementioned structure, reduces electron transport efficiency between the silicide 16 and for this reason can more efficiently reduce excess holes in the light-emitting layer 8.

Embodiment 3

Variation Example of Formation Position of Silicide Layer

Figure 14:
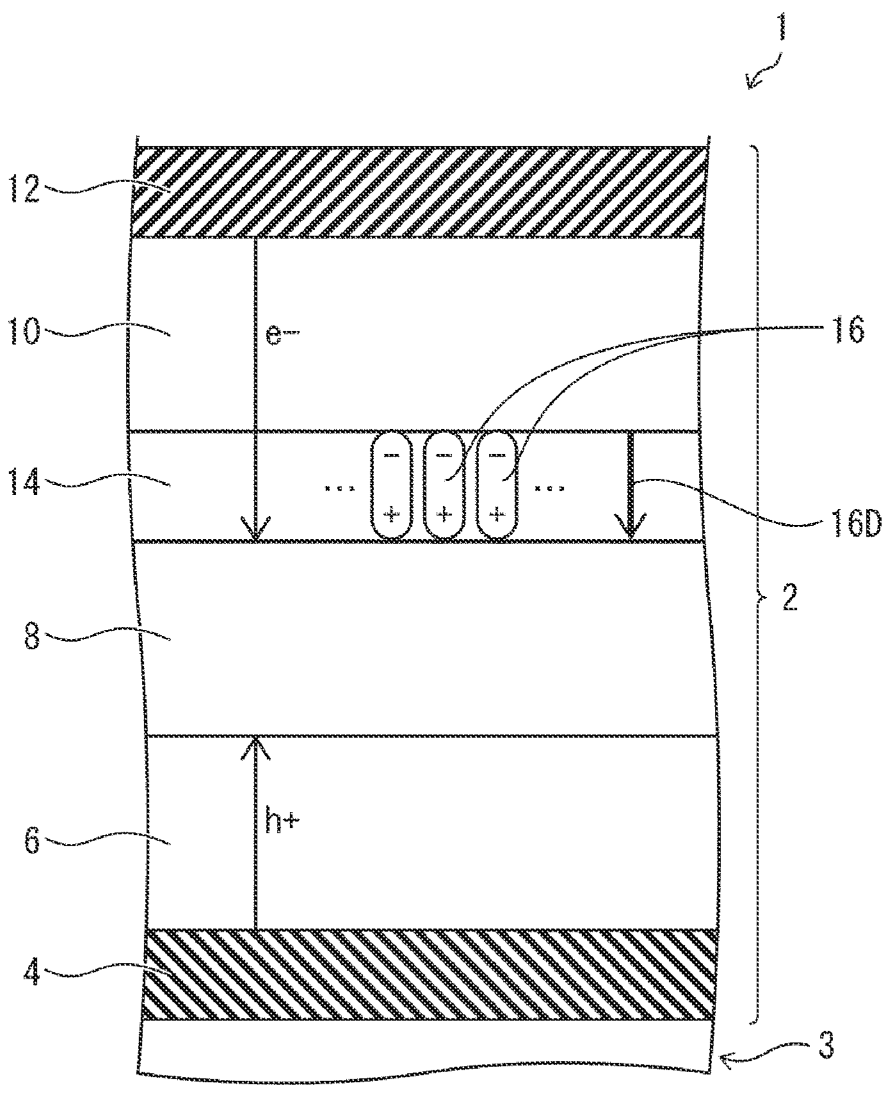
FIG. 14 is an enlarged cross-sectional view of a cross-section of layers in a light-emitting element in accordance with Embodiment 3.

FIG. 14 is an enlarged schematic cross-sectional view of a cross-section of a light-emitting element 2 in accordance with the present embodiment and the surroundings of the light-emitting element 2, taken at the position corresponding to the cross-section shown in FIG. 1.

The display device 1 in accordance with the present embodiment differs from the display device 1 in accordance with Embodiment 1 in the formation position of the silicide layer 14 among the layers in the light-emitting element 2. In particular, the light-emitting element 2 in accordance with the present embodiment is provided between the light-emitting layer 8 and the electron transport layer 10. In other words, in the present embodiment, the light-emitting layer 8 and the electron transport layer 10 are adjacent to each other via the silicide layer 14. Note that in the present embodiment, the silicide 16 in the silicide layer 14 has a dipole moment 16D directed from the electron transport layer 10 toward the light-emitting layer 8.

Except for these respects, the display device 1 in accordance with the present embodiment has the same structure as the display device 1 in accordance with Embodiment 1.

A method of manufacturing the display device 1 in accordance with the present embodiment differs from the method of manufacturing the display device 1 in accordance with Embodiment 1 in that in the former, step S8 is followed by step S14 and that step S14 is followed by step S10 and step S12. Therefore, in step S14, the light-emitting layer 8 is formed on the hole transport layer 6, and in step S10, the stack body 18A or the stack body 18B is formed on the light-emitting layer 8. Except for these respects, the method of manufacturing the display device 1 in accordance with the present embodiment is manufactured by the same method as the method of manufacturing the display device 1 in accordance with Embodiment 1.

The light-emitting element 2 in accordance with the present embodiment includes a silicide layer 14 containing the silicide 16 with a stable energy level between the light-emitting layer 8 and the electron transport layer 10. Therefore, the light-emitting element 2 in accordance with the present embodiment reduces the carrier traps formed at the interface between the light-emitting layer 8 and the silicide layer 14 and at the interface between the silicide layer 14 and the electron transport layer 10.

Depending on the design of the light-emitting element 2, the efficiency of electron transport from the cathode 12 to the light-emitting layer 8 may be low, the concentration of electrons in the light-emitting layer 8 may decrease, and the light-emitting layer 8 may lose a good charge-carrier balance. When this is the case, the silicide layer 14 in accordance with the present embodiment reduces the carrier traps formed from the electron transport layer 10 to the light-emitting layer 8, thereby improving the efficiency of electron transport from the electron transport layer 10 to the light-emitting layer 8. Therefore, the light-emitting element 2 in accordance with the present embodiment improves the efficiency of electron injection to the light-emitting layer 8, thereby improving the overall luminous efficiency of the element.

Furthermore, in the present embodiment, the dipole moment 16D of the silicide 16 in the silicide layer 14 is directed from the electron transport layer 10 toward the light-emitting layer 8. Therefore, for the reasons described in Embodiment 1 with reference to FIG. 12, the light-emitting element 2 in accordance with the present embodiment has a lowered barrier to the electrons injected from the electron transport layer 10 to the light-emitting layer 8. As a result, in the light-emitting element 2 in accordance with the present embodiment, the efficiency of electron injection to the light-emitting layer 8 is improved, the concentration of electrons in the light-emitting layer 8 rises, and the luminous efficiency of the light-emitting element 2 is improved.

Embodiment 4

Inverted Structure

Figure 15:
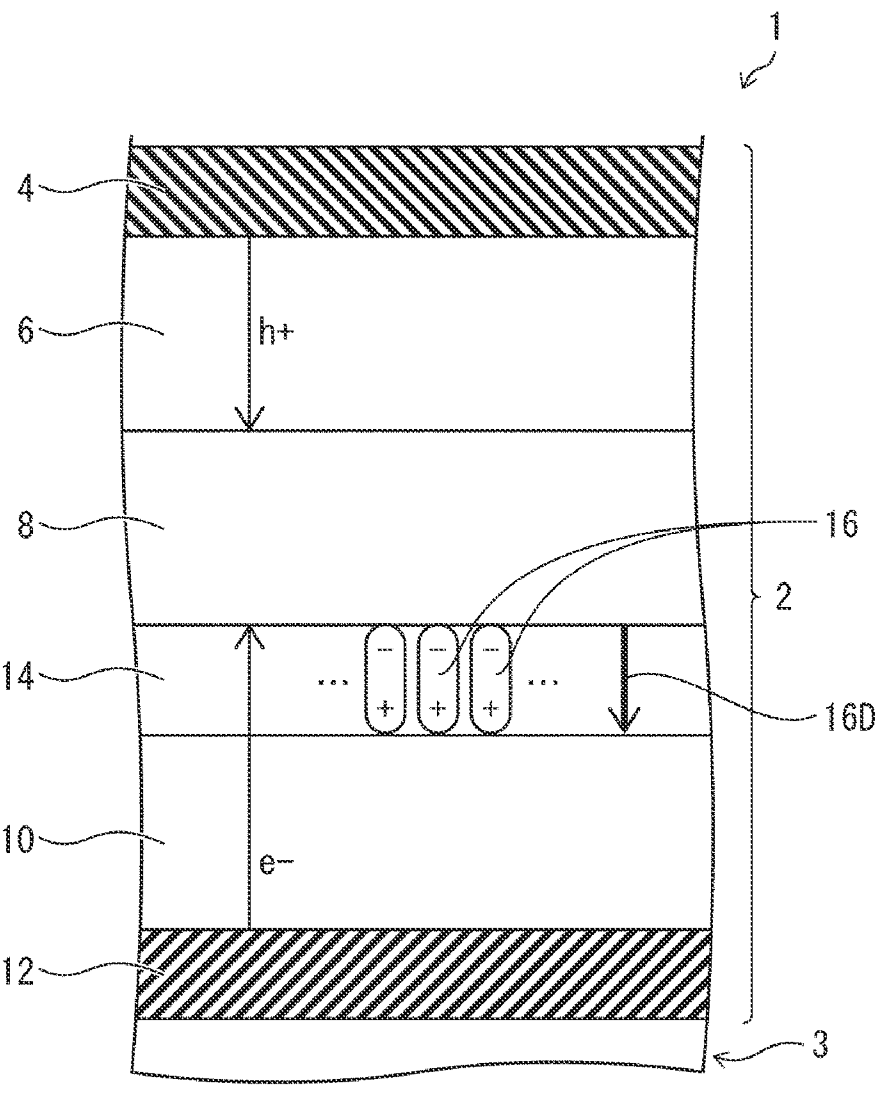
FIG. 15 is an enlarged cross-sectional view of a cross-section of layers in a light-emitting element in accordance with Embodiment 4.

FIG. 15 is an enlarged schematic cross-sectional view of a cross-section of a light-emitting element 2 in accordance with the present embodiment and the surroundings of the light-emitting element 2, taken at the position corresponding to the cross-section shown in FIG. 1.

The display device 1 in accordance with the present embodiment differs from the display device 1 in accordance with Embodiment 1 in the formation position of each layer in the light-emitting element 2. In particular, each light-emitting element 2 in accordance with the present embodiment includes a cathode 12, an electron transport layer 10, a silicide layer 14, a light-emitting layer 8, a hole transport layer 6, and an anode 4 in this order from the substrate 3 side. Therefore, in the present embodiment, the light-emitting layer 8 and the electron transport layer 10 are adjacent to each other via the silicide layer 14.

Note that in the present embodiment, the cathode 12, one for each light-emitting element 2, is a pixel electrode electrically connected to the thin film transistor Tr. The anode 4 is a common electrode formed commonly to the plurality of light-emitting elements 2. Therefore, in the present embodiment, each light-emitting element 2 can be driven by controlling the voltage applied to the cathode 12 through the thin film transistor Tr. In addition, in the present embodiment, the silicide 16 in the silicide layer 14 has a dipole moment 16D directed from the light-emitting layer 8 toward the electron transport layer 10.

Except for these respects, the display device 1 in accordance with the present embodiment has the same structure as the display device 1 in accordance with Embodiment 1.

A method of manufacturing the display device 1 in accordance with the present embodiment can be manufactured by the same method as the method of manufacturing the display device 1 in accordance with Embodiment 1, except for the order of the steps. Specifically, in the method of manufacturing the light-emitting element 2 in accordance with the present embodiment, the steps shown in FIG. 4 are performed in the order of steps S2, S18, S6, S16, S10, S12, S14, S8, and S4.

Here, step S18 is performed by forming the cathode 12 for each subpixel in an insular manner by the same method as step S4 of Embodiment 1. In addition, step S4 is performed by forming the anode 4 commonly to a plurality of subpixels by the same method as step S18 of Embodiment 1.

Similarly to the light-emitting element 2 in accordance with the preceding embodiment, the light-emitting element 2 in accordance with the present embodiment includes a silicide layer 14 containing the silicide 16 with a stable energy level between the light-emitting layer 8 and the electron transport layer 10. Therefore, the light-emitting element 2 in accordance with the present embodiment improves the efficiency of electron injection to the light-emitting layer 8, thereby improving the overall luminous efficiency of the element, for the same reasons as the reasons described in the preceding embodiment.

Furthermore, unlike the light-emitting element 2 in accordance with the preceding embodiment, the light-emitting element 2 in accordance with the present embodiment includes the silicide 16 the dipole moment 16D of which is directed from the light-emitting layer 8 toward the electron transport layer 10. Therefore, for the reasons described in Embodiment 1 with reference to FIG. 12, the light-emitting element 2 in accordance with the present embodiment has a raised barrier to the electrons injected from the electron transport layer 10 to the light-emitting layer 8.

In the light-emitting element 2 in accordance with the present embodiment, due to the silicide layer 14, the raised barrier to the electrons injected from the electron transport layer 10 to the light-emitting layer 8 lowers the concentration of electrons in the light-emitting layer 8, thereby improving the balance with the concentration of holes. Therefore, the light-emitting element 2 in accordance with the present embodiment improves luminous efficiency by reducing excess electrons in the light-emitting layer 8 and hence improving the charge-carrier balance.

Embodiment 5

Two Silicide Layers

Figure 16:
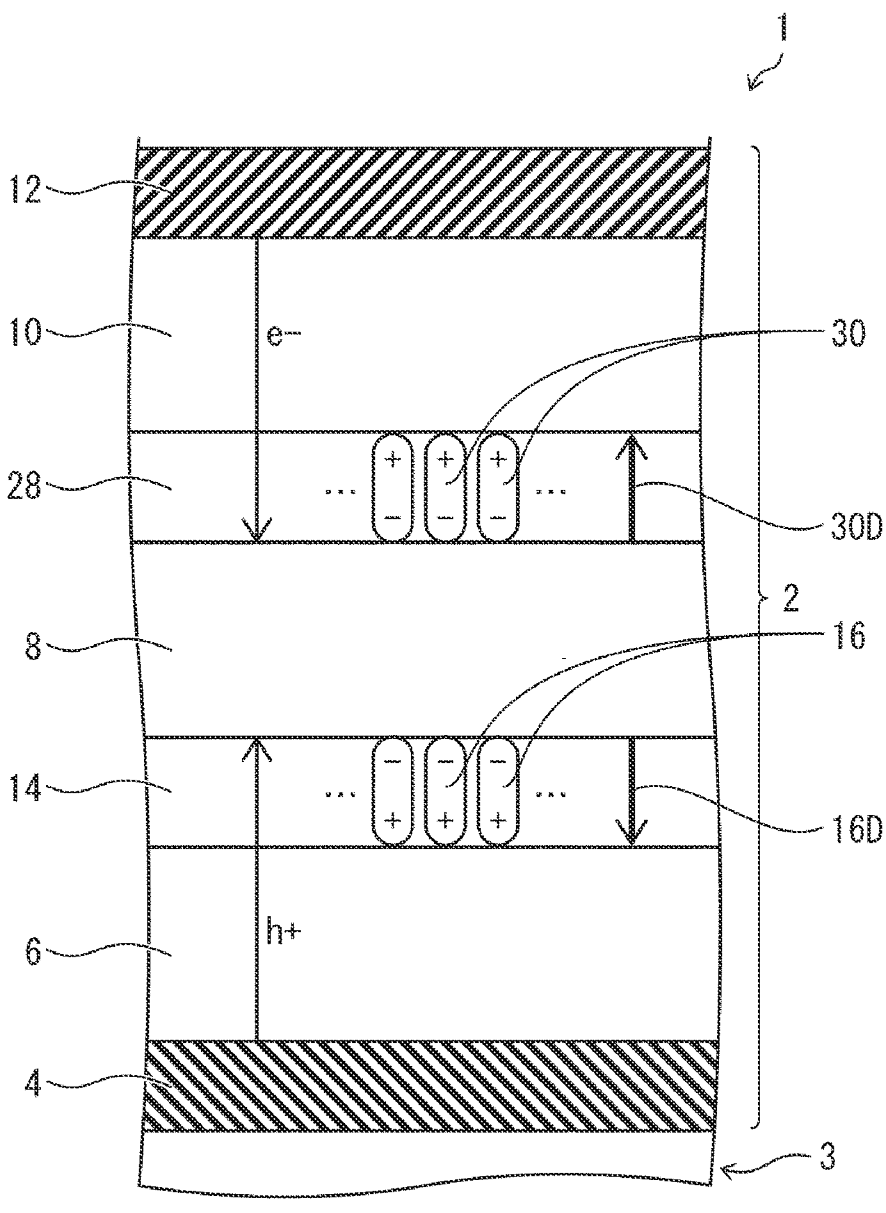
FIG. 16 is an enlarged cross-sectional view of a cross-section of layers in a light-emitting element in accordance with Embodiment 5.

FIG. 16 is an enlarged schematic cross-sectional view of a cross-section of a light-emitting element 2 in accordance with the present embodiment and the surroundings of the light-emitting element 2, taken at the position corresponding to the cross-section shown in FIG. 1.

The display device 1 in accordance with the present embodiment differs from the display device 1 in accordance with Embodiment 1 in that in the former, the light-emitting element 2 further includes a silicide layer 28 between the light-emitting layer 8 and the electron transport layer 10. The silicide layer 28 has the same structure as the silicide layer 14. In particular, the silicide layer 28 includes a plurality of silicides 30. The silicides 30 have the same structure as the silicide 16, are at least partially polar, and have a dipole moment 30D directed from the light-emitting layer 8 toward the electron transport layer 10.

Except for these respects, the display device 1 in accordance with the present embodiment has the same structure as the display device 1 in accordance with Embodiment 1.

The display device 1 in accordance with the present embodiment is manufactured by the same method as the method of manufacturing the display device 1 in accordance with the preceding embodiment, except that a step of forming the silicide layer 28 is included between step S14 and step S16. The silicide layer 28 is formed by the same method as the silicide layer 14.

The light-emitting element 2 in accordance with the present embodiment includes the silicide layer 14 containing the silicide 16 with a stable energy level between the hole transport layer 6 and the light-emitting layer 8. The light-emitting element 2 in accordance with the present embodiment further includes the silicide layer 28 containing the silicides 30 with a stable energy level between the light-emitting layer 8 and the electron transport layer 10. Therefore, the light-emitting element 2 in accordance with the present embodiment can improve the efficiency of the injection of both holes and electrons to the light-emitting layer 8, thereby improving the overall luminous efficiency of the element.

Furthermore, in the present embodiment, the dipole moment 16D of the silicide 16 is directed from the hole transport layer 6 toward the light-emitting layer 8, and the dipole moment 30D of the silicides 30 is directed from the light-emitting layer 8 toward the electron transport layer 10. Therefore, in the present embodiment, the barrier to the holes injected from the hole transport layer 6 to the light-emitting layer 8 is lowered, and the barrier to the electrons injected from the electron transport layer 10 to the light-emitting layer 8 is raised. Therefore, the light-emitting element 2 in accordance with the present embodiment improves the concentration of holes in the light-emitting layer 8 and lowers the concentration of electrons in the light-emitting layer 8. As a result, the light-emitting element 2 in accordance with the present embodiment more efficiently reduces excess electrons in the light-emitting layer 8, thereby improving the charge-carrier balance in the light-emitting layer 8 and hence improving the overall luminous efficiency of the light-emitting element 2.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting element comprising:
- a first electrode;
- a first charge transport layer;
- a silicide layer containing silicide;
- a light-emitting layer; and
- a second electrode, all of which are provided in this stated order, wherein
  - the first charge transport layer and the light-emitting layer are adjacent to each other via the silicide layer, and
  - the silicide is at least partially polar.

2. The light-emitting element according to claim 1, wherein the silicide has a columnar structure or a particulate structure.

3. The light-emitting element according to claim 1, wherein the silicide layer is a continuous film of the silicide.

4. The light-emitting element according to claim 1, wherein the silicide layer has a collective structure of nanoparticles of the silicide in contact with either one or both of the light-emitting layer and the first charge transport layer.

5. The light-emitting element according to claim 1, wherein the silicide at least partially has a dipole moment directed from the light-emitting layer toward the first charge transport layer.

6. The light-emitting element according to claim 1, wherein the silicide at least partially has a dipole moment directed from the first charge transport layer toward the light-emitting layer.

7. The light-emitting element according to claim 1, wherein
- the first electrode is an anode,
- the second electrode is a cathode, and
- the first charge transport layer is a hole transport layer.

8. The light-emitting element according to claim 7, further comprising a second charge transport layer between the light-emitting layer and the second electrode, wherein the second charge transport layer is an electron transport layer.

9. The light-emitting element according to claim 8, wherein the silicide layer is further provided between the light-emitting layer and the second charge transport layer, and
- the light-emitting layer and the second charge transport layer are adjacent to each other via the silicide layer.

10. The light-emitting element according to claim 1, wherein
- the first electrode is a cathode,
- the second electrode is an anode, and
- the first charge transport layer is an electron transport layer.

11. The light-emitting element according to claim 10, further comprising a second charge transport layer between the light-emitting layer and the second electrode, wherein the second charge transport layer is a hole transport layer.

12. The light-emitting element according to claim 1, wherein the silicide has a molecular structure of $MSi_x$ where M is a metal element and x is a real number, and x is such that $0.8 \leq x \leq 1.2$ when the silicide has a stoichiometric composition of MSi and such that $1.6 \leq x \leq 2.4$ when the silicide has a stoichiometric composition of $MSi_2$.

13. The light-emitting element according to claim 12, wherein the metal element is with 6 or more d electrons per atom.

14. The light-emitting element according to claim 1, wherein the silicide layer has a thickness less than, or equal to, 20 nm.

15. The light-emitting element according to claim 1, wherein the silicide has a Si concentration distribution that varies from one position to another in a thickness direction of the silicide layer.

16. The light-emitting element according to claim 1, wherein the silicide has a metal concentration distribution that varies from one position to another in a thickness direction of the silicide layer.

17. The light-emitting element according to claim 1, wherein the silicide layer is formed by thermally processing a stack of a layer of Si nanoparticles and a layer of metal nanoparticles.

18. A display device having a display area where a plurality of pixels is provided, the display device comprising:

a substrate; and light-emitting elements, including the light-emitting element according to claim 1, positioned, respectively, in the plurality of pixels on the substrate, wherein the substrate includes a plurality of thin film transistors that drives, respectively, the light-emitting elements.

19. A light-emitting element comprising:

a first electrode;

a first charge transport layer;

a silicide layer containing silicide;

a light-emitting layer; and a second electrode, all of which are provided in this stated order, wherein the first charge transport layer and the light-emitting layer are adjacent to each other via the silicide layer, and the silicide layer has a collective structure of nanoparticles of the silicide in contact with either one or both of the light-emitting layer and the first charge transport layer.

20. A light-emitting element comprising:

a first electrode;

a first charge transport layer;

a silicide layer containing silicide;

a light-emitting layer; and a second electrode, all of which are provided in this stated order, wherein the first charge transport layer and the light-emitting layer are adjacent to each other via the silicide layer, the light-emitting element further comprises a second charge transport layer between the light-emitting layer and the second electrode, the silicide layer is further provided between the light-emitting layer and the second charge transport layer, and the light-emitting layer and the second charge transport layer are adjacent to each other via the silicide layer.

* * * * *